(12) United States Patent
Narayanan et al.

(10) Patent No.: US 8,829,965 B2
(45) Date of Patent: Sep. 9, 2014

(54) SYSTEM AND METHOD TO PERFORM SCAN TESTING USING A PULSE LATCH WITH A BLOCKING GATE

(75) Inventors: Venkatasubramanian Narayanan, San Diego, CA (US); Kashyap R. Bellur, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 66 days.

(21) Appl. No.: 13/564,254

(22) Filed: Aug. 1, 2012

(65) Prior Publication Data

US 2014/0035645 A1 Feb. 6, 2014

(51) Int. Cl.
*H03K 3/356* (2006.01)

(52) U.S. Cl.
USPC .............................. 327/212; 327/199; 327/202

(58) Field of Classification Search
USPC .......... 327/199, 202, 203, 208–212, 215, 218
See application file for complete search history.

(56) References Cited

U.S. PATENT DOCUMENTS

| | | | |
|---|---|---|---|
| 6,393,592 B1 | 5/2002 | Peeters et al. | |
| 6,911,846 B1 | 6/2005 | Blomgren et al. | |
| 7,157,930 B2 | 1/2007 | Hirata | |
| 7,274,233 B2 | 9/2007 | Branch et al. | |
| 7,274,234 B2 | 9/2007 | Branch et al. | |
| 7,596,732 B2 | 9/2009 | Branch et al. | |
| 7,961,559 B2 | 6/2011 | Dixon et al. | |
| 8,037,382 B2 | 10/2011 | Gunsasekar | |
| 8,078,925 B1 | 12/2011 | Bhatia et al. | |
| 2007/0208912 A1* | 9/2007 | Garg et al. | ..................... 711/154 |
| 2007/0273420 A1* | 11/2007 | Torvi et al. | ..................... 327/202 |
| 2009/0132879 A1 | 5/2009 | Gangappa | |
| 2009/0189662 A1* | 7/2009 | Uchida | ........................ 327/199 |
| 2009/0300448 A1 | 12/2009 | Tomita et al. | |
| 2012/0072793 A1 | 3/2012 | Rao et al. | |

OTHER PUBLICATIONS

International Search Report and Written Opinion—PCT/US2013/052758—ISA/EPO—Nov. 7, 2013.

* cited by examiner

*Primary Examiner* — Long Nguyen
(74) *Attorney, Agent, or Firm* — Paul S. Holdaway

(57) ABSTRACT

A system and method to perform scan testing using a pulse latch with a blocking gate is disclosed. In a particular embodiment, a scan latch includes a pulse latch operable to receive data while a pulse clock signal has a first logical clock value and a blocking gate coupled to an output of the pulse latch. The blocking gate is operable to propagate the data from the output of the pulse latch while the pulse clock signal has a second logical clock value.

43 Claims, 9 Drawing Sheets

SYSTEM AND METHOD TO PERFORM SCAN TESTING USING A PULSE LATCH WITH A BLOCKING GATE

I. FIELD

The present disclosure is generally related to memory devices and more specifically to scan chains.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Wireless telephones are becoming increasingly smaller, resulting in use of smaller integrated circuits (ICs), Full-scan testing is a design-for-test (DFT) technique for testing storage elements (e.g., flip-flops) in an IC to verify correct operation of a scan chain of the IC. A typical implementation of a scan chain includes multiple flip-flops (or scan registers) that are serially coupled together to form one or more scan chains. This implementation results in approximately 18 poly pitches (e.g., a designation of an area of an IC based on a number of polysilicon lines) per scan register, which impedes reduction of the size of an IC.

In an attempt to reduce a poly pitch value, scan chains have used a pulse latch instead of a scan register. However, using pulse latches rather than scan registers may result in a race condition due to timing variances within and between each pulse latch. To address the race condition, delay gates (e.g., multiple inverters) have been added between each successive pulse latch. The addition of the delay gates increases the size and cost of the scan chain.

III. SUMMARY

A scan chain device having a series of stages (e.g., scan latches) that each include a pulse latch and. a blocking gate is disclosed. In a particular stage, the pulse latch (including a pulse latch element) receives data and the blocking gate propagates data from the pulse latch to an output of the particular stage. The pulse latch may receive the data when a pulse clock signal has a first logical clock value and the blocking gate may propagate the data when the pulse clock signal has a second logical clock value. For example, the pulse latch and the blocking gate may each include a clocked gate (e.g., a clocked switch), such as a transmission gate, where the clocked gate of the pulse latch is in an opposite state as the clocked gate of the blocking gate. The use of the clocked gates may reduce a probability of a race condition in the scan chain resulting from the use of the pulse latch element in each stage.

In a particular embodiment, the clocked gate of the blocking gate includes a transmission gate. The transmission gate may utilize long channel transistors to control leakage current through the transmission gate while the transmission gate is in a disabled state. The use of the transmission gate as the clocked gate of the blocking gate, in conjunction with the pulse latch, enables a reduced number of poly pitches as compared to a scan latch having an equivalent number of stages and utilizing pulse latches and multiple inverters (e.g., delay elements).

In a particular embodiment, a scan latch includes a pulse latch operable to receive data while a pulse clock signal has a first logical clock value and a blocking gate that is coupled to an output of the pulse latch. The blocking gate is operable to propagate the data from the output of the pulse latch while the pulse clock signal has a second logical clock value.

In another particular embodiment, a scan chain includes a first stage including a first pulse latch operable to receive data while a pulse clock signal has a first logical clock value. The first stage further includes a first blocking gate coupled to an output of the first pulse latch and operable to propagate data from the output of the first pulse latch to an output of the first stage while the pulse clock signal has a second logical clock value. The scan chain includes multiple stages (e.g., a second stage responsive to the output of the first stage).

In another particular embodiment, a method includes receiving and latching scan input data at a pulse latch while a pulse clock signal has a first logical clock value (e.g., a logical one value). The method further includes propagating the scan input data from an output of the pulse latch to an output of a blocking gate while the pulse clock signal has a second logical clock value (e.g., a logical zero value).

In another particular embodiment, a scan latch includes means for receiving and latching scan input data while a pulse clock signal has a first logical clock value. The scan latch further includes means for propagating the scan input data from the means for receiving and latching while the pulse clock signal has a second logical clock value.

In another particular embodiment, a non-transitory computer readable medium including instructions is disclosed. The instructions included in the non-transitory computer readable medium, when executed by a processor, cause the processor to provide a test control signal to an input of a multiplexer of a scan latch circuit and to provide scan input data to the input of the multiplexer. A pulse latch of the scan latch circuit receives and latches the scan input data while a pulse clock signal has a first logical clock value, and the scan input data propagates from the pulse latch to an output of a blocking gate of the scan latch circuit while the pulse clock signal has a second logical clock value.

One particular advantage provided by at least one of the disclosed embodiments is a reduced probability of a race condition occurring in the scan chain as compared, to a system using only pulse latches. The design also reduces a number of poly pitches needed to fabricate the design as compared to alternative designs that add a plurality of inverters to provide a delay between successive pulse latches in a scan chain. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Particular embodiments of the present disclosure are described further with reference to the drawings. In the description, common features are designated by common reference numbers throughout the drawings.

Figure 1:
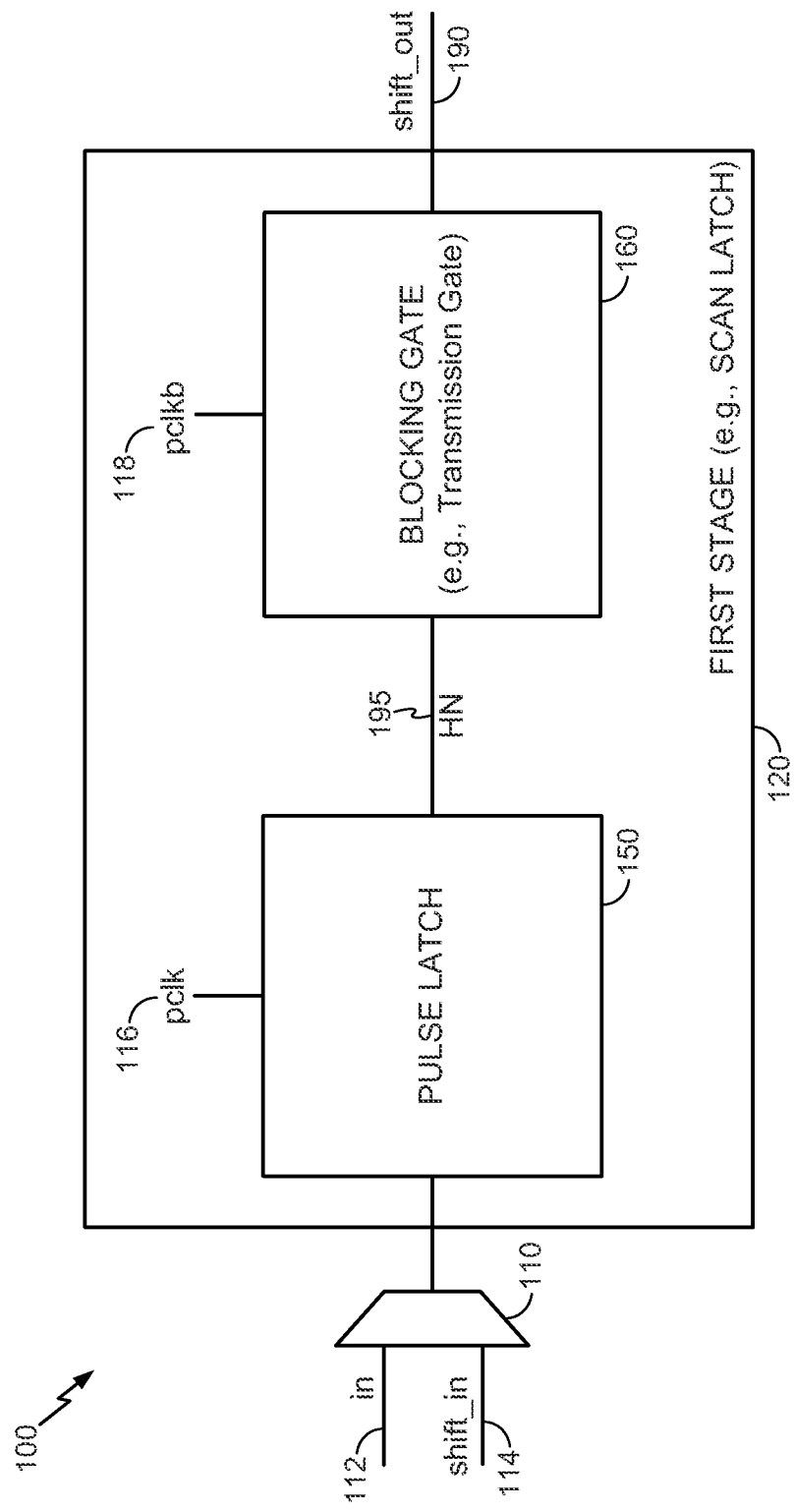
FIG. 1 is a block diagram of a first particular illustrative embodiment of a first stage of a scan chain device.

Referring to FIG. 1, a particular illustrative embodiment of a system including a first stage of a scan chain device is disclosed and generally designated 100. The system 100 may include a multiplexer 110 coupled to a first stage 120 (e.g., a scan latch) of the scan chain. The first stage 120 includes a pulse latch 150 and a blocking gate 160. The first stage 120 of the scan chain having the blocking gate 160 may enable on-chip testing of a memory cell array that includes a plurality of pulse latches coupled in series.

The multiplexer 110 may receive input data 112 and/or shift_in input data 114. An output of the multiplexer 110 may be provided to the first stage 120. The first stage 120 may be one of a plurality of stages of the scan chain and may be directly coupled to the multiplexer 110 with no intervening stage. In an alternative embodiment, one or more intervening stages of the scan chain may be positioned between the multiplexer 110 and the first stage 120. The output of the multiplexer 110 may be based on a test control signal (not shown) as described further with reference to FIG. 2. For example, the multiplexer 110 may output the input data 112 and/or the shift_in input data 114 based on the test control signal. In a particular embodiment, when the test control signal is disabled, the multiplexer 110 provides the input data 112 to the first stage 120. When the test control signal is enabled, the multiplexer 110 provides the shift_in input data 114 to the first stage 120. The shift_in input data 114 may be provided by a test interface (not shown) as described further with reference to FIG. 2.

The first stage 120 may include the pulse latch 150 coupled to the blocking gate 160 via a holding node (HN) 195. The pulse latch 150 may be coupled to the output of the multiplexer 110 and may receive data (e.g., one of the input data 112 and/or the shift_in input data 114) from the multiplexer 110. In a particular embodiment, the pulse latch 150 is directly coupled to the output of the multiplexer 110. The holding node 195 may represent a latched data value outputted from the pulse latch 150. The pulse latch 150 may be responsive to a first pulse clock signal (pclk) 116 as described further with reference to FIGS. 2, 3, and 5. For example, the pulse latch 150 may receive and latch data while the first pulse clock signal 116 has a first logical clock value (e.g., a logical one value). The pulse latch 150 may not receive and latch data from the multiplexer 110 while the first pulse clock signal 116 has a second logical clock value (e.g., a logical zero value).

The blocking gate 160 may receive data from the pulse latch 150 via the holding node 195 and propagate the data from the pulse latch 150 to an output of the blocking gate 160. In a particular embodiment, the output of the blocking gate 160 is provided as an output of the first stage 120 (e.g., shift_out data 190). The blocking gate 160 may be responsive to a second pulse clock signal (pclkb) 118 as described further with reference to FIGS. 2-5. For example, the blocking gate 160 may propagate received data from the pulse latch 150 to the output of the blocking gate 160 while the second pulse clock signal 118 has the first logical clock value (e.g., the logical one value). The blocking gate 160 may not propagate received data from the output of the pulse latch 150 while the second pulse clock signal 118 has the second logical clock value (e.g., the logical zero value). In another particular embodiment, the shift_out data 190 is provided to another stage (e.g., a subsequent stage) of the scan chain. For example, the shift_out data 190 may be provided to another stage that is similar to the first stage 120. The shift_out data 190 may also be provided to the test interface that provides the shift_in data 114.

In a particular embodiment, the blocking gate 160 includes a transmission gate that is responsive to the second pulse clock signal 118. For example, the transmission gate may be configured to propagate data received from the output of the pulse latch 150 while the second pulse clock signal 118 has the first logical clock value (e.g., the logical one value). Additionally, the transmission gate may not propagate data received from the output of the pulse latch 150 while the second pulse clock 118 has the second logical clock value (e.g., the logical zero value).

The second pulse clock signal 118 may be an inverse of the first pulse clock signal 116. For example, a pulse phase of the first pulse clock signal 116 may correspond to a non-pulse phase of the second pulse clock signal 118. Further, a non-pulse phase of the first pulse clock signal 116 may correspond to a pulse phase of the second pulse clock signal 118. The relationship between the first pulse clock signal 116 and the second, pulse clock signal 118 is described in further detail with respect to FIG. 5.

In a particular embodiment, the first pulse clock signal 116 and the second pulse clock signal 118 may be generated from a single pulse clock signal. For example, the first pulse clock signal 116 may be generated and the second pulse clock signal 118 may be an inverse of (e.g., generated from) the first pulse clock signal 116. In another particular embodiment, the first pulse clock signal 116 and the second pulse clock signal 118 are generated as two separate pulse clock signals where the first pulse clock signal 116 is generated independently of the second pulse clock signal 118.

In an alternative embodiment, the first stage 120 may be responsive to a single pulse clock signal that is provided to the first stage 120. The pulse latch may be responsive to the single pulse clock signal to receive and latch scan input data while the single pulse clock signal has a first logical clock value (e.g., a logical one value) and the blocking gate may be responsive to the single pulse clock signal to propagate the data from the output of the pulse latch while the single clock signal has a second logical clock value (e.g., a logical zero value).

In a particular embodiment, the first logical clock value is a high value (e.g., a logical high one value) and the second logical clock value is a low value (e.g., a logical low zero value). In an alternative embodiment, the first logical clock value is a low value (e.g., the logical low zero value) and the second logical clock value is a high value (e.g., the logical high one value).

During operation, the multiplexer 110 may receive the input data 112 and the shift_in input data 114. The multiplexer 110 may provide the input data 112 or the shift_in input data 114 to the first stage 120 based on a test control signal. When the multiplexer 110 provides the shift_in input data 114 to the first stage 120, the first stage 120 may receive and latch data from the multiplexer 110 at the pulse latch 150 while the first pulse clock signal 116 has the first logical clock value (e.g., the logical one value). The blocking gate 160 may be disabled, responsive to the second pulse clock signal 118 having the second logical clock value (e.g., the logical zero value), while the pulse latch 150 is active (receiving and latching the data while the first pulse clock signal 116 has the first logical clock value). The blocking gate 160 may propagate data from the pulse latch 150 to an output of the blocking gate 160 (e.g., the shift_out data 190) while the second pulse clock signal 118 has the first logical clock value (e.g., the logical one value). The pulse latch 150 is disabled, responsive to the first pulse clock signal 116 having the second logical clock value (e.g., the logical zero value), while the blocking gate 160 is active (propagating data to a shift_out data 190 while the second pulse clock signal 118 has the first logical clock value). In a particular embodiment, the latched data at the pulse latch 150 is indicated by a value of the holding node 195. The second pulse clock signal 118 may have the first logical clock value (e.g., the logical one value) while the first pulse clock signal 116 has the second logical clock value (e.g., the logical zero value) (since the second pulse clock signal 118 is the inverse of the first pulse clock signal 116). The blocking gate 160 may provide the propagated data as the output (e.g., the shift_out data 190) of the first stage 120. The shift_out data 190 output from the first stage 120 may be provided to an input of a subsequent stage and/or to a test interface (not shown).

The scan latch (e.g., the first stage 120) including the pulse latch 150 and the blocking gate 160 may occupy less surface area of an integrated circuit that includes the scan latch having a series of inverters. The scan latch may also reduce a likelihood of a race condition being present in a scan chain having the scan latch.

Figure 2:
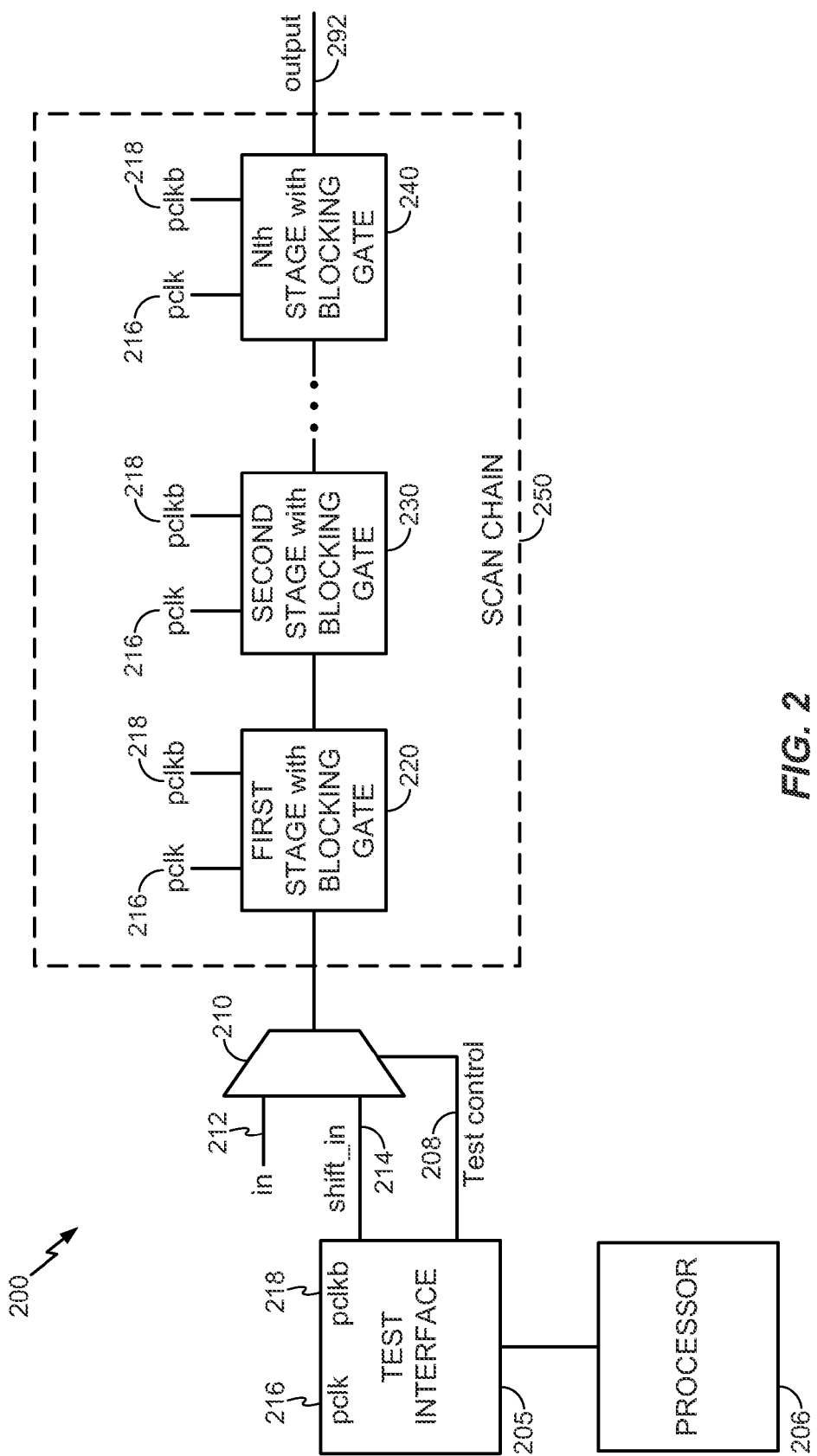
FIG. 2 is a block diagram of a particular illustrative embodiment of a scan chain device including a plurality of stages.

Referring to FIG. 2, a particular illustrative embodiment of a system including a scan chain that includes a plurality of stages is disclosed and generally designated 200. The system 200 may include a processor 206, a test interface 205, a multiplexer 210, and a scan chain 250 having a plurality of stages (e.g., multiple scan latches). The plurality of stages of the scan chain 250 may include a first stage 220, a second stage 230, and an $N^{th}$ stage 240. For example, the multiplexer 210 may include the multiplexer 110 of FIG. 1 and each stage of the plurality of stages may include the first stage 120 of FIG. 1 (or a similar stage).

The processor 206 may be coupled to the test interface 205. In a particular embodiment, the processor 206 is integrated into the test interface 205. The processor 206 may initiate a test of the scan chain 250. For example, the processor 206 may be operable to provide a test control signal 208 to the multiplexer 210 via the test interface 205. Further, the processor 206 may be operable to provide shift_in data 114 (e.g., scan input data) 114 to the multiplexer 110 via the test interface 205. In an embodiment, the processor 206 may generate the first pulse clock signal 216, the second pulse clock signal 218, or a combination thereof, via the test interface 205. The processor 206 may also be operable to receive data that is output from the scan chain 250 (e.g., the output 292) and/or from a particular stage of the scan chain 250.

The test interface 205 may be coupled, to the multiplexer 210 to provide shift_in data 214 and the test control signal 208 to the multiplexer 210. In a particular embodiment, the test control signal 208 enables the multiplexer 210 to provide the shift_in data 214 as an output of the multiplexer 210. The test interface 205 may generate the first pulse clock signal (pclk) 216 and the second pulse clock signal (pclkb) 218 that are provided to the scan chain 250. For example, the first pulse clock signal 216 and the second pulse clock signal 218 may include the first pulse clock signal 116 and the second pulse clock signal 118 of FIG. 1, respectively. In a particular embodiment, the test interface 205 provides the first pulse clock signal 216 and the second pulse clock signal 218 to each of the first stage 220, the second stage 230, and the $N^{th}$ stage 240.

The multiplexer 210 may receive input data 212 and/or the shift_in data 214. The shift_in data 214 may be received from the test interface 205 via a test port (not shown), such as a Joint Test Action Group (JTAG) test port (e.g., a port conforming to an Institute of Electrical and Electronics Engineers (IEEE) 1149.1 Standard Access Port and Boundary-Scan Architecture standard). An output of the multiplexer 210 may be based on the input data 212 or the shift_in data 214, as directed by the test control signal 208. The output of the multiplexer 210 may be provided to the first stage 220. For example, when the test control signal 208 is disabled, the multiplexer 210 may provide the input data 212 to the first stage 220. When the test control signal 208 is enabled, the multiplexer 210 may provide the shift_in data 214 to the first stage 220. In a particular embodiment, the multiplexer 210 is directly coupled to the first stage 220 with no intervening stages.

The first stage 220 may be responsive to the first pulse clock signal 216 and the second pulse clock signal 218. For example, the first stage 220 may receive and latch data from the multiplexer 210 at time periods determined by the first pulse dock signal 216 and may propagate the data to an output of the first stage 220 at other time periods based on the second pulse clock signal 218. In a particular embodiment, the first stage 220 is operable to receive and latch data when the first pulse clock signal 216 has a first logical clock value. Additionally, the first stage 220 may propagate data to an output of the first stage 220 when the second pulse clock signal 218 has the first logical clock value. In a particular embodiment, the second pulse clock signal 218 has the first logical clock value (e.g., a logical one value) while the first pulse dock signal 216 has a second logical clock value (e.g., a logical zero value) (since the second pulse clock signal 218 is an inverse of the first pulse clock signal 216). In a particular embodiment, the first stage 220 is an initial stage of the scan chain 250.

The output of the first stage 220 may be coupled to an input of the second stage 230. For example, the first stage 220 may propagate data to the output of the first stage 220, and the data output from the first stage 220 may be provided to the second stage 230. In an alternative embodiment, data output from the output of the first stage 220 may also be provided to the test interface 205 and/or the processor 206.

The input of the second stage 230 may receive data from the output of the first stage 220 and operate in a manner similar to the first stage 220. For example, the second stage 230 may be responsive to the first pulse clock signal 216 to receive and latch data (received, from the first stage 220) when the first pulse clock signal 216 has the first logical clock value (e.g., the logical one value). Accordingly, the second stage 230 may not receive data from the first stage 220 while the first pulse clock signal 216 has the second logical clock value (e.g., the logical zero value). The second stage 230 may also propagate data through the second stage 230 to an output of the second stage 230 responsive to the second pulse clock signal 218 when the second clock signal 218 has the first logical clock value (e.g., the logical one value) (while the first clock signal 216 has the second logical clock value (e.g., the logical zero value)). The output of the second stage 230 may be coupled to an input of a subsequent stage. In an alternative embodiment, data output from the output of the second stage 230 is also provided to the test interface 205 and/or the processor 206.

The scan chain 250 may include the $N^{th}$ stage 240 that is representative of a final stage of the scan chain 250. The scan chain 250 may include one or more stages between the second stage 230 and the $N^{th}$ stage 240 as indicated in FIG. 2. In a particular embodiment, the second stage 230 is the $N^{th}$ stage 240 and thus represents the final stage of the scan chain 250. Thus, 'N' is an integer greater than one. The $N^{th}$ stage 240 may receive and latch data from a stage prior to the $N^{th}$ stage 240 and may operate in a manner similar to that of the first stage 220 and the second stage 230. For example, the $N^{th}$ stage 240 may be responsive to the first pulse clock signal 216 to receive and latch data when the first pulse clock signal 216 has the first logical clock value (e.g., the logical one value). The $N^{th}$ stage 240 may also propagate data through the $N^{th}$ stage 240, to an output 292 of $N^{th}$ stage 240, responsive to the second pulse clock signal 218 when the second clock signal 218 has the first logical clock value (e.g., the logical one value) (while the first clock signal 216 has the second logical clock value (a logical zero value)). The output 292 of the $N^{th}$ stage 240 may be an output of the scan chain 250. In a particular embodiment, the output 292 is provided to the test interface 205 and/or the processor 206.

Each stage of the scan chain 250 (e.g., the first stage 220, the second stage 230, and the $N^{th}$ stage 240) may include a corresponding blocking gate (not shown), such as the blocking gate 160 of FIG. 1. In a particular embodiment, each blocking gate includes a corresponding transmission gate (not shown) responsive to one of the first pulse clock signal 216 and/or the second pulse clock signal 218. For example, each transmission gate may be operable to propagate data through the corresponding stage to an output of the corresponding stage while the second pulse clock signal 218 has the first logical clock value (e.g., the logical one value). The output of each stage of the scan chain 250 may be provided to the test interface 205 and/or the processor 206.

Although the scan chain 250 of the system 200 depicts three stages, one of skill in the art will appreciate that the scan chain 250 may include a single stage or a plurality of stages. Additionally, the scan chain 250 illustrates a single scan chain where each stage of the scan chain 250 is serially coupled. One of skill in the art will appreciate that the system 200 may include more than one scan chain (not shown). In a particular embodiment, an output of the multiplexer 210 is coupled to an input of one or more scan chains to allow testing of multiple scan chains in parallel. Further, an output of a particular stage in a particular scan chain may be coupled to (e.g., branch to) multiple subsequent stages of the particular scan chain to test the multiple stages in parallel.

During operation, the multiplexer 210 may provide the input data 212 or the shift_in data 214 (from the test interface 205) to the first stage 220 based on the test control signal 208 received from the test interface 205. The first stage 220 may receive and latch data from the output of the multiplexer 210 while the first pulse clock signal 216 has the first logical clock value (e.g., the logical one value). The first stage 220 may be operable to propagate data through the first stage 220 to the output of the first stage 220 while the second pulse clock signal 218 has the first logical clock value (e.g., the logical one value).

Each subsequent stage of the scan chain 250 (e.g., the second stage 230 and the $N^{th}$ stage 240) may receive data from a preceding stage. Data may propagate through each stage of the scan chain 250 in a manner similar to propagation of data through the first stage 220 (e.g., at times based on the first pulse clock signal 216 and the second pulse clock signal 218). The $N^{th}$ stage 240 (e.g., the final stage of the scan chain 250) may provide the output 292 (e.g., an output of the scan chain 250) while the second pulse clock signal 218 has the first logical clock value. The output 292 from the $N^{th}$ stage 240 may be provided to the test interface 205 and/or the processor 206.

The scan chain 250 that includes one or more stages each, having a blocking gate, may reduce a surface area of an integrated circuit. The configuration of the scan chain 250 may also reduce a likelihood of a race condition being present in the scan chain 250.

Figure 3:
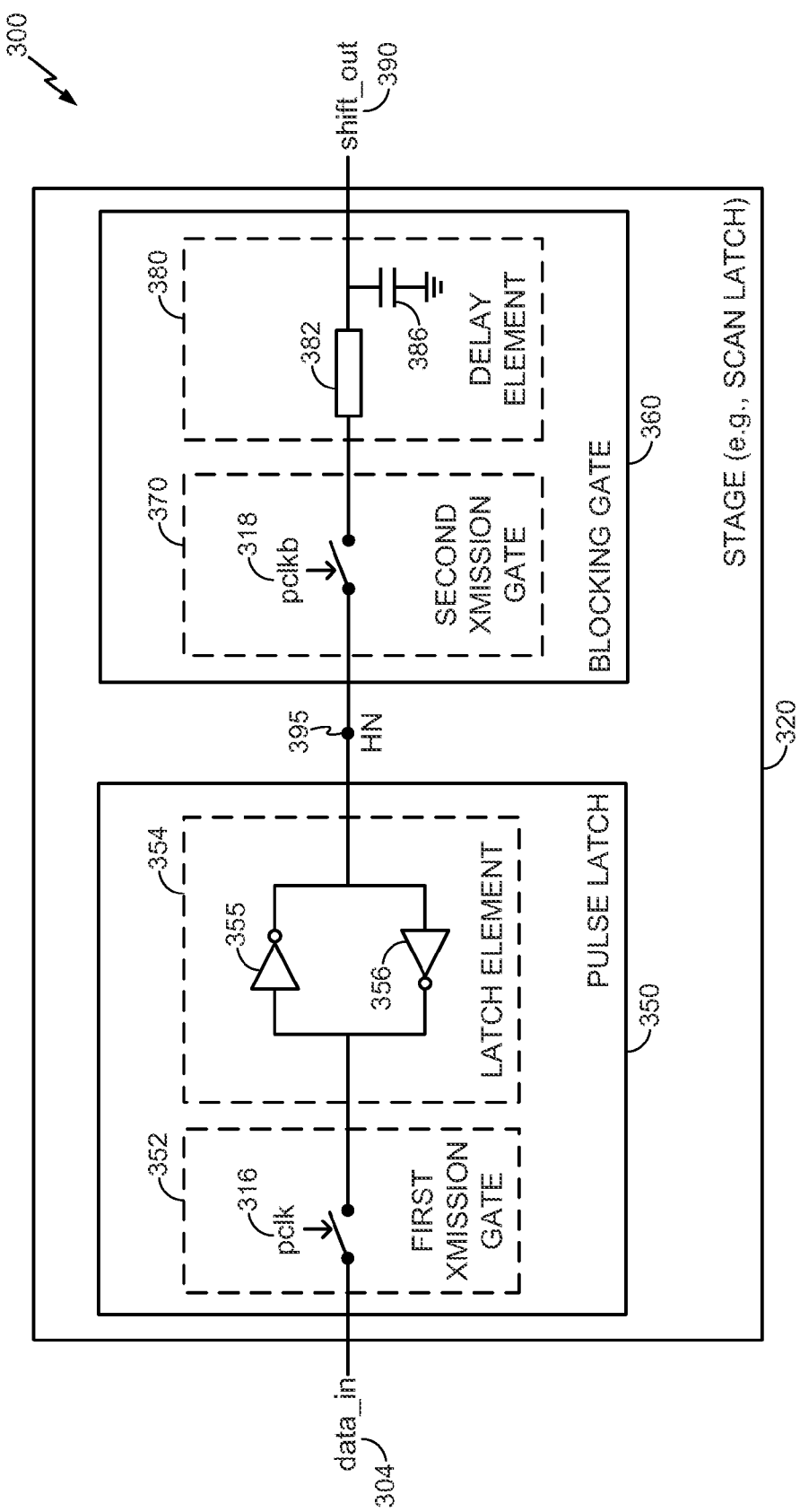
FIG. 3 is a diagram of a second particular illustrative embodiment of a first stage of a scan chain device.

Referring to FIG. 3, a particular illustrative embodiment of a stage of a scan chain device is disclosed and generally designated 300. The stage 300 may include a scan latch 320 having a pulse latch 350 and a blocking gate 360. For example, the scan latch 320 may be the first stage 120 of FIG. 1, the first stage 220, the second stage 230, and/or the $N^{th}$ stage 240 of FIG. 2, or any combination thereof. The scan latch 320 may be included as part of a scan chain (not shown), such as the scan chain 250 of FIG. 2. The scan latch 320 including the blocking gate 360 may enable on-chip testing of a memory cell array that includes a plurality of serially connected scan latches.

An input of the scan latch 320 may be configured to receive data_in 304. For example, the data_in 304 may be received from a prior stage of the scan chain or from a multiplexer. In a particular embodiment, the scan latch 320 receives the data_in 304 at the pulse latch 350 of the scan latch 320.

The pulse latch 350 may be coupled to the blocking gate 360 via a holding node (HN) 395. The pulse latch 350 may include a first transmission gate 352 (represented as a switch in FIG. 3) and a latch element 354. The first transmission gate 352 may receive the data_in 304 and may be operable to selectively provide the received data to the latch element 354. The first transmission gate 352 may be responsive to a first pulse clock signal (pclk) 316. The first pulse clock signal 316 may include the first pulse clock signal 116 of FIG. 1 or the first pulse clock signal 216 of FIG. 2. The first transmission gate 352 may be enabled (e.g., in a closed position) when the first pulse clock signal 316 has a first logical clock value (e.g., a logical one value). The first transmission gate 352 may be disabled (e.g., in an open position) when the first pulse clock signal 316 has a second logical clock value (e.g., a logical zero value). An output of the first transmission gate 352 may be coupled to the latch element 354.

An input of the latch element 354 may receive the data_in 304 from the output of the first transmission gate 352. The latch element 354 may latch the data received from the first transmission gate 352 and such latched value may be indicated at the holding node (HN) 395. For example, a value of the holding node 395 may reflect a value of the data_in 304 latched by the latch element 354.

The latch element 354 may include a first inverter 355 and a second inverter 356. The first inverter 355 and the second inverter 356 may be coupled in parallel to form a positive feedback system to latch the data_in 304. For example, the input of the latch element 354 may be coupled to an input of the first inverter 355 and an output of the second inverter 356. Additionally, an output of the latch element (coupled to the holding node 395) may be coupled to an output of the first inverter 355 and an input of the second inverter 356.

In a particular embodiment, when the input of the latch element 354 is a high value (e.g., the output of the first inverter 355 and the input of the second inverter 356 are a high value), an output of the second inverter 356 and an input of the first inverter 355 are forced to a low value. Accordingly, when the input of the latch element 354 is the high value, the output of the latch element 354 and the holding node 395 are the low value. Likewise, when the input of the latch element 354 is the low value, the output of the latch element 354 (e.g., the holding node 395) is the high value.

The blocking gate 360 may be coupled to an output of the pulse latch 350 via the holding node 395. The blocking gate 360 may include a second transmission gate 370 and a delay element 380. In an alternative embodiment, the blocking gate 360 may include one of the second transmission gate 370 and the delay element 380. The second transmission gate 370 may receive data from the output of pulse latch 350 and propagate the data to an output of the second transmission gate 370. The second transmission gate 370 may selectively propagate the data based on the second pulse clock signal (pclkb) 318. Additionally, the second transmission gate 370 may be responsive to the second pulse clock signal 318. For example, the second pulse clock signal 318 may include the second pulse clock signal 118 of FIG. 1 or the second pulse clock signal 218 of FIG. 2. The second transmission gate 370 may be enabled (e.g., in a closed position) when the second pulse clock signal 318 has the first logical clock value (e.g., the logical one value). The second transmission gate 370 may be disabled (e.g., in an open position) when the second pulse clock signal 318 has the second logical clock value (e.g., the logical zero value). In a particular embodiment, the second pulse clock signal 318 has the first logical clock value (e.g., the logical one value) while the first pulse clock signal 316 has the second logical clock value (e.g., the logical zero value), and the second pulse clock signal 318 has the second logical clock value (e.g., the logical zero value) while the first pulse clock signal 316 has the first logical clock value (e.g., the logical one value). Accordingly, the second transmission gate 370 may have an opposite state (e.g., an active state or a disabled state) with respect to a state of the first transmission gate 352 (e.g., a disabled state or an active state, respectively).

The delay element 380 may receive data from the output of the second transmission gate 370. The delay element 380 may include a resistive element 382 (e.g., a resistor) and a capacitive element 386 (e.g., a capacitor). In an alternative embodiment, the delay element 380 includes an always-on transmission gate instead of the resistive element 382 and the capacitive element 386, as described further with reference to FIG. 4. The delay element 380 may delay data received from the second transmission gate 370 and then propagate the data to an output (e.g., the shift_out data 390) of the blocking gate 360. The output of the delay element 380 may include an output 390 of the scan latch 320. The output of the scan latch 320 (e.g., the shift_out data 390) may include the shift_out data 190 of FIG. 1 or an output of the first stage 220, an output of the second stage 230, or the output 292 of FIG. 2. The shift_out data 390 may be provided to a subsequent state of the scan chain and/or may be provided to a test interface (not shown), such as the test interface 205 of FIG. 2.

During operation, the scan latch 320 may receive the data_in 304 at the first transmission gate 352 of the pluse latch 350. The scan latch 320 may receive and latch the data_in 304 while the first pulse clock signal 316 has the first logical clock value (e.g., the logical one value). The second transmission gate 370 may be enabled (e.g., closed) while the second pulse clock signal 318 has the first logical clock value (e.g., the logical one value). When the second transmission gate 370 is enabled, the blocking gate 360 may propagate a data value from the holding node 395 to the output of the scan latch 320 as shift_out data 390.

The scan latch 320 including the pulse latch 350 and the blocking gate 360 may reduce a surface area of an integrated circuit corresponding to a scan chain including the scan latch. The scan latch 320 may also reduce a likelihood of a race condition being present in the scan chain having the scan latch by including a blocking gate having a transmission gate that operates to prevent data from propagating to the output of the scan latch while scan input data is being latched at the pulse latch.

Figure 4:
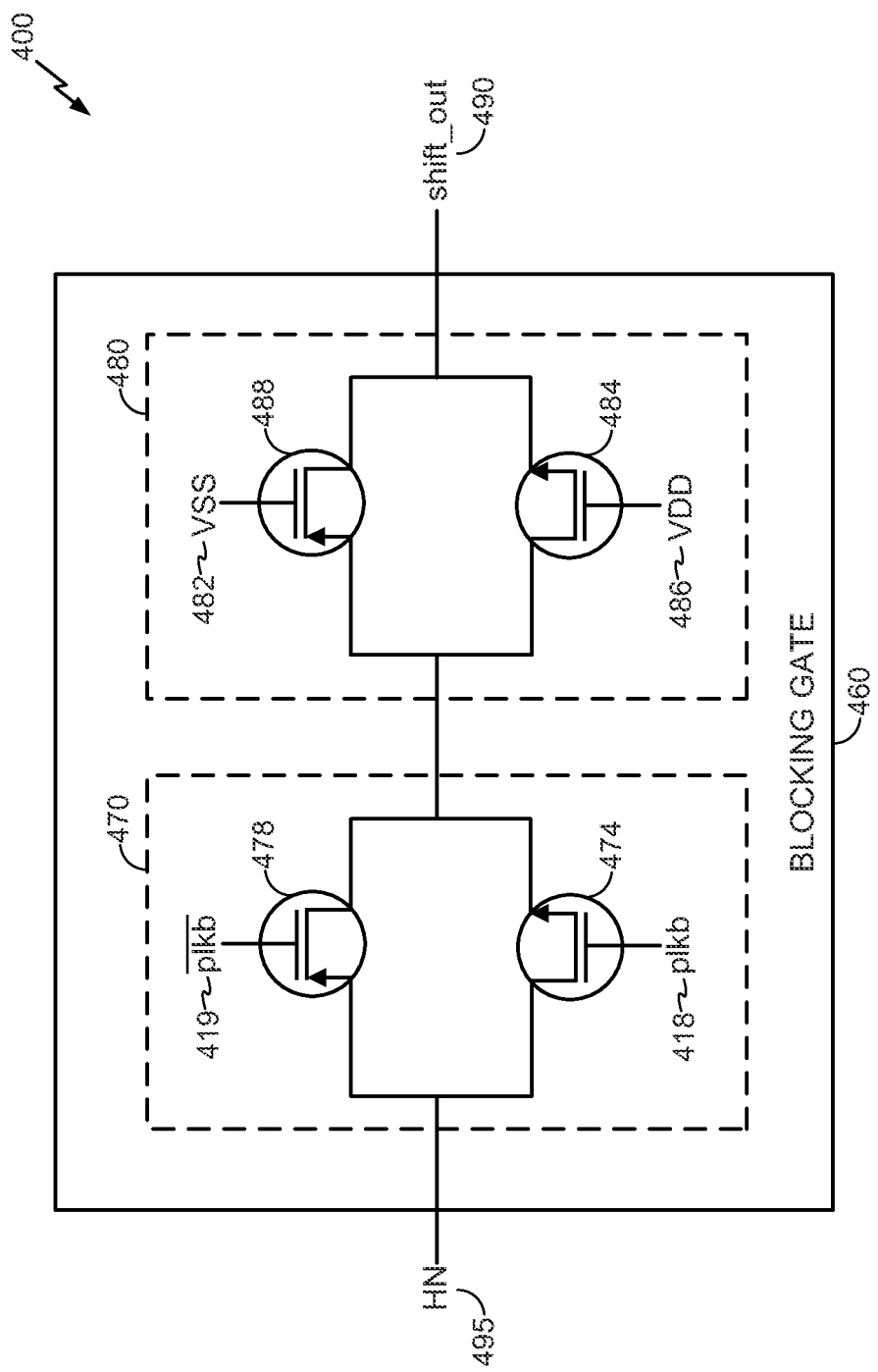
FIG. 4 is a diagram of a particular illustrative embodiment of a blocking gate of a stage of a scan chain.

Referring to FIG. 4, a particular illustrative embodiment of a portion of a stage of a scan chain is disclosed and generally designated 400. The portion of the stage 400 may include a blocking gate 460 including a transmission gate, such as a first transmission gate 470, and a delay element 480. For example, the blocking gate 460 may include the blocking gate 160 of FIG. 1 or the blocking gate 360 of FIG. 3.

The blocking gate 460 may receive data via a holding node (HN) 495. For example, the holding node 495 may include the holding node 195 of FIG. 1 or the holding node 395 of FIG. 3. In a particular embodiment, the blocking gate 460 receives data via the holding node 495 at the first transmission gate 470. The first transmission gate 470 may selectively propagate the received data from the holding node 495 to an output of the blocking gate 460. In a particular embodiment, the first transmission gate 470 may propagate the data via the delay element 480 to the shift_out data 490. In an alternative embodiment, the blocking gate 460 may not include the delay element 480 and, in this case, the output of the first transmission gate 470 may be provided as the shift_out data 490 of the blocking gate 460.

The first transmission gate 470 may include a first transistor 474 and a second transistor 478. The first transmission gate 470, including the first transistor 474 and the second transistor 478, may be responsive to a second pulse clock signal (pclkb) 418 and an inverse (e.g., a logical inverse) of the second pulse clock signal 418 (e.g., a first pulse clock signal (pclkb) 419). For example, the second pulse clock signal 418 may include the second pulse clock signal 118 of FIG 1, the second pulse clock signal 218 of FIG. 2, or the second pulse clock signal 318 of FIG 3. The first pulse clock signal 419 may include the first pulse clock signal 116 of FIG. 1, the first pulse clock signal 216 of FIG. 2, or the first pulse clock signal 316 of FIG. 3. The inverse relationship between the second pulse clock signal 418 and the first pulse clock signal 419 is described in further detail with reference to FIG. 5.

The first transistor 474 may be enabled (e.g., in a closed position) when the second pulse clock signal 418 has a first logical clock value (e.g., a logical one value) and may be disabled (e.g., in an open position) when the second pulse clock signal 418 has a second logical clock value (e.g., a logical zero value). Further, the second transistor 478 may be enabled, (e.g., in a closed, position) when the first pulse clock signal 419 has the second logical clock value (e.g., the logical zero value) and may be disabled (e.g., in a open position) when the first pulse clock signal 419 has the first logical clock value (e.g., the logical one value). In a particular embodiment, the second pulse clock signal 418 has the second logical clock value (e.g., logical zero value) while the first pulse clock signal 419 has the first logical clock value (e.g., logical one value), and the second pulse clock signal 418 has the first logical clock value (e.g., logical one value) while the first pulse clock signal 419 has the second logical clock value (e.g., logical zero value). Accordingly, the first transmission gate 470 may be enabled (e.g., both the first transistor 474 and the second transistor 478 are in a closed position) when the second, pulse clock signal 418 has the first logical clock clock value and may be disabled (e.g., both the first transistor 474 and the second transistor 478 are in an open position) when the second pulse clock signal 418 has the second logical clock value.

The first transistor 474 may be coupled in parallel with the second transistor 478 in the first transmission gate 470. For example, the input of the first transmission gate 460 may be coupled, to a drain of first transistor 474 and to a source of second transistor 478. An output of the first transmission gate 470 may be coupled to a source of the first transistor 474 and to a drain of the second transistor 478. A gate of the first transistor 474 may be coupled to the second pulse clock signal 418, and a gate of the second transistor 478 may be coupled to the first pulse clock signal 419.

The first transistor 474 may include an n-type metal-oxide semiconductor field-effect transistor (MOSFET), and the second, transistor 478 may include a p-type MOSFET, In a particular embodiment, the first transistor 474 includes a first long channel transistor having a first channel length, and the second transistor 478 includes a second long channel transistor having a second channel length. The first channel length may be approximately equal to the second channel length. For example, the first channel length and the second channel length may each be approximately eighty (80) nanometers (nm).

In a particular embodiment, the first channel length of the first transistor 474 and the second channel length of the second transistor 478 may each be greater than a transistor channel length of a transistor of a transmission gate included in a pulse latch (not shown) corresponding to the portion of the stage 400. For example, the particular transmission gate included in the pulse latch may include a transmission gate 352 of the pulse latch 350 of FIG. 3. In a particular embodiment, the first channel length of the first transistor 474 is approximately twice as long (e.g., twice as large) as the transistor channel length of the transistor of the transmission gate included in the pulse latch (not shown).

The delay element 480 may receive data from the holding node 495 via the first transmission gate 470 when the first transmission gate 470 is enabled. The delay element 480 may delay data received from the first transmission gate 470 and propagate the received data, after a delay time, to the shift_out data 490 of the blocking gate 460. For example, the delay element 480 may include the delay element 180 of FIG. 1 or the delay element 380 of FIG. 3.

In a particular embodiment, the delay element 480 may include a second transmission gate having a third transistor 484 and a fourth transistor 488. In an alternative embodiment, the delay element 480 may include one or more inverters. In a particular embodiment, the delay element 480 is in an always-on state (e.g., always enabled). For example, a gate of the third transistor 484 may be coupled to a first potential (VDD) 486 (e.g., a first voltage source) such that the third transistor 484 is consistently enabled (e.g., in a closed position). As a further example, a gate of the fourth transistor 488 may be coupled to a second potential (VSS) 482 (e.g., a second voltage source) such that the fourth transistor 488 is consistently enabled (e.g., in a closed position).

The third transistor 484 may include an n-type MOSFET and the fourth transistor 488 may include a p-type MOSFET. The third transistor 484 may be coupled in parallel with the fourth transistor 488. For example, an input of the delay element 480 may be coupled to a drain of third transistor 484 and a source of fourth transistor 488. An output of the blocking gate 460 (e.g., the shift_out data 490) may be coupled to a source of third transistor 484 and a drain of fourth transistor 488.

In a particular embodiment, the third transistor 484 includes a third channel having a third channel length and the fourth transistor 488 includes a fourth channel having a fourth channel length. The third, channel length may be approximately equal to the fourth channel length. For example, the third channel length and the fourth channel length may each be approximately forty (40) nanometers (nm). In another particular embodiment, the third channel length of the third transistor 484 and/or the fourth channel length of the fourth transistor 488 may each be less than (e.g., shorter) the first channel length of the first transistor 474. For example, the third channel length of the third transistor 484 and/or the fourth channel length of the fourth transistor 488 may each be approximately half as long (e.g., half the length) as the first channel length of the first transistor 474.

An output of the delay element 480 may be provided as an output of the blocking gate 460, such as the shift_out data 490. In a particular embodiment, the shift_out data 490 is provided to a subsequent stage (not shown) of a scan chain and/or to a test interface (not shown).

During operation, the first transmission gate 470 of the blocking gate 460 may be operable to selectively propagate data from the holding node 495 to the shift_out data 490 of the blocking gate 460 via the delay element 480 while the second pulse clock signal 418 has the first logical clock value. The shift_out data 490 may be provided from the blocking gate 460 to an input of a next subsequent stage (not shown) of a scan chain and/or a test interface (not shown).

Figure 5:
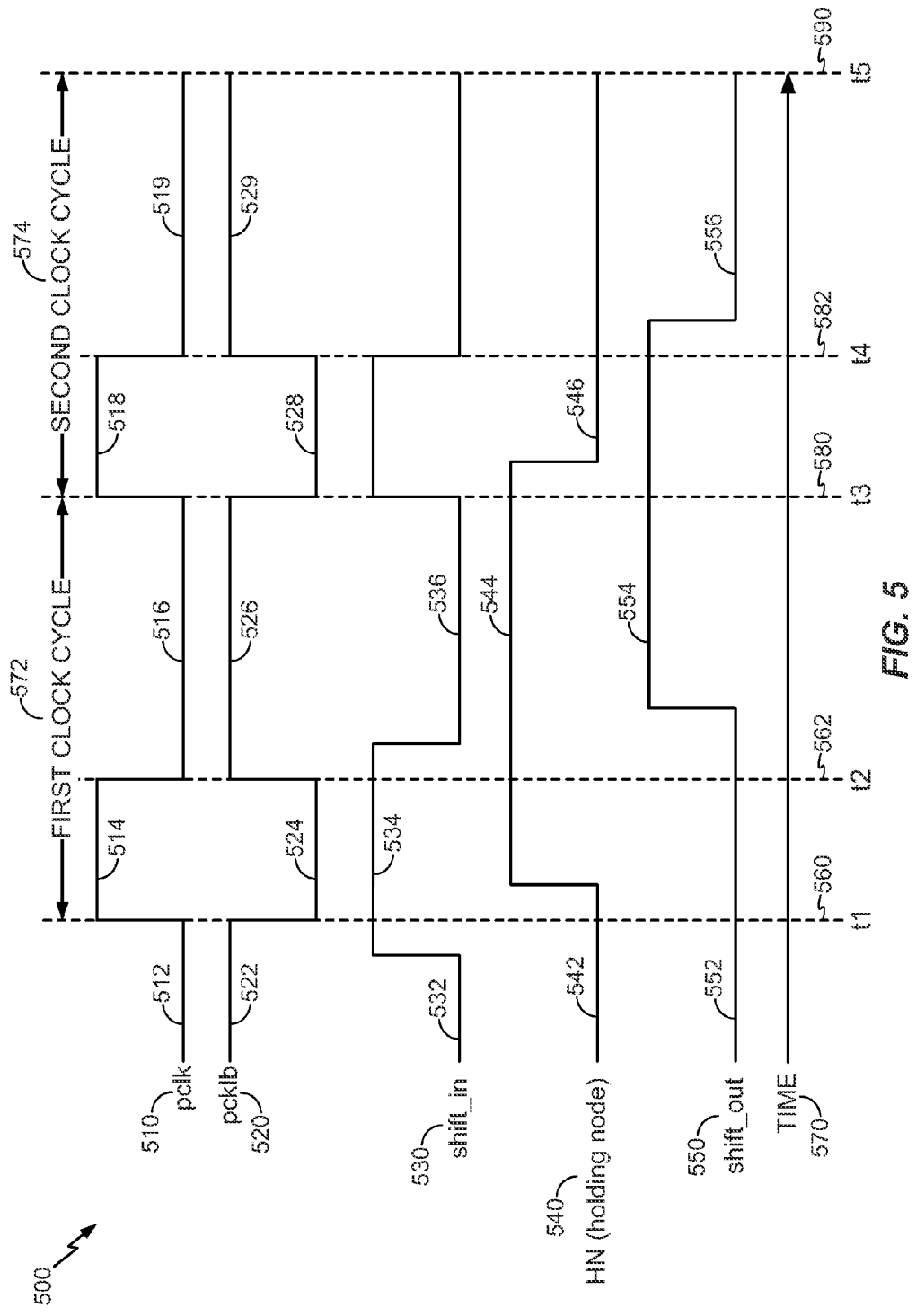
FIG. 5 is an exemplary timing diagram of a particular illustrative embodiment of a stage of a scan chain device.

Referring to FIG. 5, an exemplary timing diagram of a particular illustrative embodiment of an input to a multiplexer propagated through a stage (e.g., a scan latch) of a scan chain is disclosed and generally designated 500. For example, the exemplary timing diagram 500 may illustrate timing characteristics of the system 100 of FIG. 1, the system 200 of FIG. 2, or the stage 300 of FIG. 3. In a particular embodiment, the timing diagram illustrates an input of a multiplexer propagated though an initial stage of a scan chain. The timing diagram 500 depicts two clock cycles of a scan chain test.

The two clock cycles include a first clock cycle 572 starting at a time (t1) 560 and ending at a time (t3) 580 and a second clock cycle 574 starting at the time (t3) 580 and ending at a time (t5) 590. The timing diagram 500 depicts values of a first pulse clock signal (pclk) 510, a second pulse clock signal (pcklb) 520, a shift_in signal 530, a holding node (HN) 540, and an output shift_out signal 550 represented over a time period (TIME) 570. The shift_in signal 530 may be provided to a multiplexer of a scan chain. For example, the shift_in signal 530 may include the shift_in data 114 of FIG. 1, the shift_in data 214 of FIG. 2, or the data_in 304 of FIG. 3.

The output of the multiplexer may be provided to a stage of the scan chain. The stage may include a pulse latch and a blocking gate. The holding node 540 may be indicative of a value of latched data of the stage. For example, the holding node 540 may include the holding node 195 of FIG. 1, the holding node 395 of FIG. 3, or the holding node 495 of FIG. 4. The output shift_out signal 550 may indicate an output of the stage after data has propagated though the stage. For example, the output shift_out signal 550 may include the shift_out data 190 of FIG. 1, the output 292 of FIG. 2, the shift_out data 390 of FIG. 3, or the shift_out data 490 of FIG. 4.

The first pulse clock signal (pclk) 510 and/or the second pulse clock signal (pclkb) 520 may be provided to the stage of the scan chain to enable operation of one or more switches (e.g., one or more transmission gates) of the stage. For example, the first pulse clock signal (pclk) 510 may include the first pulse clock signal 116 of FIG. 1, the first pulse clock signal 216 of FIG. 2, the first pulse clock signal 316 of FIG. 3, or the first pulse clock signal 419 of FIG. 4, For example, the second pulse clock signal (pclkb) 520 may include the second pulse clock signal 118 of FIG. 1, the second pulse clock signal 218 of FIG. 2, the second pulse clock signal 318 of FIG. 3, or the second pulse dock signal 418 of FIG. 4. The second pulse clock signal (pclkb) 520 may be an inverse of first pulse clock signal (pclk) 510.

The timing diagram illustrates the inverse relationship between the first clock
signal (pclk) 510 and the second pulse clock signal (pclkb) 520. For example, during a first pulse clock cycle 572, at the time (t1) 560, the first pulse clock signal (pclk) 510 transitions to a logical one value 514 and the second pulse dock signal (pclkb) 520 transitions to a logical zero value 524. Further, at a time (t2) 562, the first pulse clock signal (pclk) 510 transitions from the logical one value 514 to the logical zero value 516 and the second pulse clock signal (pclkb) 520 transitions from the logical zero value 524 to the logical one value 526. The timing diagram also depicts the same inverse relationship between the first clock signal (pclk) 510 and the second clock signal (pclkb) 520 during a second pulse clock cycle 574. Thus, when the first pulse clock signal (pclk) 510 has a high value, the second pulse clock signal (pclkb) 520 has a low value, and. when the first pulse clock signal (pclk) 510 has a low value, the second, pulse clock signal (pclkb) 520 has a high value. For example, when the first pulse clock signal (pclk) 510 has the logical one value, the second pulse clock signal (pclkb) 520 has the logical zero value, and when the first pulse clock signal (pclk) 510 has the logical zero value, the second pulse clock signal (pclkb) 520 has the logical one value.

Prior to the time (t1) 560, the shift_in signal 530 transitions from an initial value 532 to a first data value 534. At the time (t1) 560, the first clock pulse signal 510 transitions from an initial value 512 (e.g., the logical zero value) to the logical one value 514. The logical one value 514 may be associated with (e.g., indicate) a clock cycle pulse of the first clock pulse signal 510 between the time (t1) 560 and the time (t2) 562. Additionally at the time (t1) 560, the second pulse clock signal (pclkb) 520 transitions from an initial value 522 (e.g., the logical one value) to a logical zero value 524.

The transition of the first pulse clock signal 510 to the logical one value 514 enables (e.g., closes) a first transmission gate of a pulse latch of the stage. For example, the pulse latch may include the pulse latch 150 of FIG. 1 or the pulse latch 350 of FIG. 3. The enabled first transmission gate of the pulse latch permits the first data value 534 of the shift_in signal 530 to propagate to the holding node 540. The first transmission gate may remain enabled between the time (t1) 560 and the time (t2) 562. The holding node 540 transitions from an initial value 542 (e.g., the logical zero value) to a first data value 544 (e.g., the logical one value) after the time (t1) 560.

The transition of the second pulse clock signal (pclkb) 520 from the initial value 522 (e.g. a logical one value) to the logical zero value 524 at the time (t1) 560 disables (e.g., opens) a second transmission gate of a blocking gate of the stage. The second transmission gate remains disabled between the time (t1) 560 and the time (t2) 562. For example, the blocking gate may include the blocking gate 160 of FIG. 1, the blocking gate 360 of FIG. 3 or the blocking gate 460 of FIG. 4. The disabled second transmission gate of the blocking gate blocks (e.g., prohibits) the first data value 534 of the shift_in signal 530 from propagating to the output shift_out signal 550 between the time (t1) 560 and the time (t2) 562. Accordingly, the output shift_out signal 550 remains at an initial value 552 (e.g., the logical zero value) between the time (t1) 560 and the time (t2) 562.

At the time (t2) 562, the first clock pulse signal 510 transitions from the logical
one value 514 to the logical zero value 516. Additionally at the time (t2) 562, the second clock pulse signal second pulse clock signal (pclkb) 520 transitions from the logical zero value 524 to a logical one value 526. The transition of the first pulse clock signal to the logical zero value 516 disables (e.g., opens) the first transmission gate of the pulse latch of the stage. The first transmission gate remains disabled between the time (t2) 562 and the time (t3) 580. The disabled first transmission gate of the pulse latch blocks a value of the shift_in signal 530 from being received at a latching element of the stage. Accordingly, the holding node 540 remains at the first data value 544 (e.g., the logical one value) between the time (t2) 562 and the time (t3) 580. The transition of the second pulse clock signal (pclkb) 520 from the logical zero value 524 to the logical one value 526 at the time (t2) 562 enables (e.g., closes) the second transmission gate of the blocking gate of the stage. The second transmission gate remains enabled between the time (t2) 562 and the time (t3) 580. The enabled second transmission gate propagates the first data value 544 of the holding node 540 to the output shift_out signal 550 between the time (t2) 562 and the time (t3) 580. Accordingly, the output shift_out signal 550 transitions from the initial value 552 (e.g., the logical zero value) to the first data value 554 between the time (t2) 562 and the time (t3) 580. During the time between the time (t2) 562 and the time (t3) 580, the shift_in signal 530 transitions from the first data value 534 to a second data value 536 prior to the second pulse clock cycle 574.

The timing diagram 500 illustrates how a scan latch having a pulse latch and a blocking gate may reduce the probability of a race condition during the first clock cycle 572. For example, by disabling the blocking gate between the time (t1) 560 and the time (t2) 562 when the pulse latch is enabled between the time (t1) 560 and the time (t2) 562, the first data value 534 of the shift_in signal 530 is prevented from propagating to the output shift_out signal 550. After the pulse latch is disabled (e.g., preventing a value of the shift_in signal 530 from being received at a latch element) at the time (t2) 562, the blocking gate may be enabled to propagate the first data value 544 of the holding node 540 (i.e., the value latched by the pulse latch) to the output shift_out signal 550. No contention exists between the shift_in signal 530 value, the holding node 540 value, and the output shift_out signal 550 value of the stage during the first clock cycle 572.

The second clock cycle 574 may begin at the time (t3) 580 when the first clock pulse signal 510 transitions from the logical zero value 516 to a logical one value 518 and when the second clock pulse signal (pclkb) 520 transitions from the logical one value 526 to a logical zero value 528. A transition of the first pulse clock signal 510 to the logical one value 518 enables (e.g., closes) the first transmission gate, and permits the second data value 536 of shift_in signal 530 to be latched at the holding node 540. The first transmission gate may remain enabled between the time (t3) 580 and the time (t4) 582. Accordingly, the holding node 540 transitions from the first data value 544 to a second data value 546 after the time (t3) 580. A transition of the second pulse clock signal (pelkb) 520 from the logical one value 526 to the logical zero value 528 at the time (t3) 580 disables (e.g., opens) a second transmission gate of the stage of the scan chain between the time (t3) 580 and the time (t4) 582. The disabled second transmission gate blocks (e.g., prohibits) the second data value 536 of the shift_in signal 530 from propagating to the output shift_out signal 550, Accordingly, the output shift_out signal 550 remains at the first data value 554 between the time (t3) 580 and the time (t4) 582.

At the time (t4) 582, the first dock pulse signal 510 transitions from the logical one value 518 to a logical zero value 519 and the second pulse clock signal (pclkb) 520 transitions from the logical zero value 528 to a logical one value 529.

The transition of the first pulse clock signal 510 to the logical zero value 519 disables (e.g., opens) the first transmission gate of the pulse latch of the first stage between the time (t4) 582 and the time (t5) 590. The disabled first transmission gate of the pulse latch prevents a value of the shift_in signal 530 from being received at a latching element of the stage. Accordingly, the holding node 540 remains at the second data value 546 between the time (t4) 582 and the time (t5) 590. The transition of the second pulse clock signal (pclkb) 520 from the logical zero value 528 to the logical one value 529 at the time (t4) 582 enables (e.g., closes) the second transmission gate, and the enabled second transmission gate propagates the second data value 546 of the holding node 540 to the output shift_out signal 550 between the time (t4) 582 and the time (t5) 590. Accordingly, the output shift_out signal 550 transitions from the first data value 554 to a second data value 556 between the time (t4) 582 and the time (t5) 590.

As indicated above, the timing diagram 500 may be applied to the stage 300 of FIG. 3. The timing diagram 500, as applied to the stage 300, may appear to illustrate an inconsistent relationship in polarity between the shift_in signal 530, the holding node 540, and the output shift_out signal 550. As one of skill in the art would appreciate, inverters may be placed into the circuit of the stage 300 to maintain consistent polarity. For example, a multiplexer may include or be coupled, to an inverter.

Although the timing diagram 500 depicts a two pulse clock cycle scan latch test, one of skill in the art will appreciate that a scan chain test may include a single pulse clock cycle scan chain test or scan chain test having more than two clock cycles. One of skill in the art will also appreciate that, although the shift_in data 530 depicts a bit pattern of '10' binary (i.e. logical '1' (one) during the first clock cycle and a logical '0' (zero) during the second clock cycle), the shift_in signal 530 can include any bit pattern. The depiction of a magnitude of the signals represented, in the timing diagram 500 is not intended to be to scale, and the representative timing is an illustrative example of a timing characteristic of a scan latch device. One of skill in the art would also appreciate that data may not be limited to logical one and logical zero values, as indicated in FIGS. 1-5. One of skill in the art would also appreciate that timing characteristics among individual scan latch devices may vary.

Figure 6:
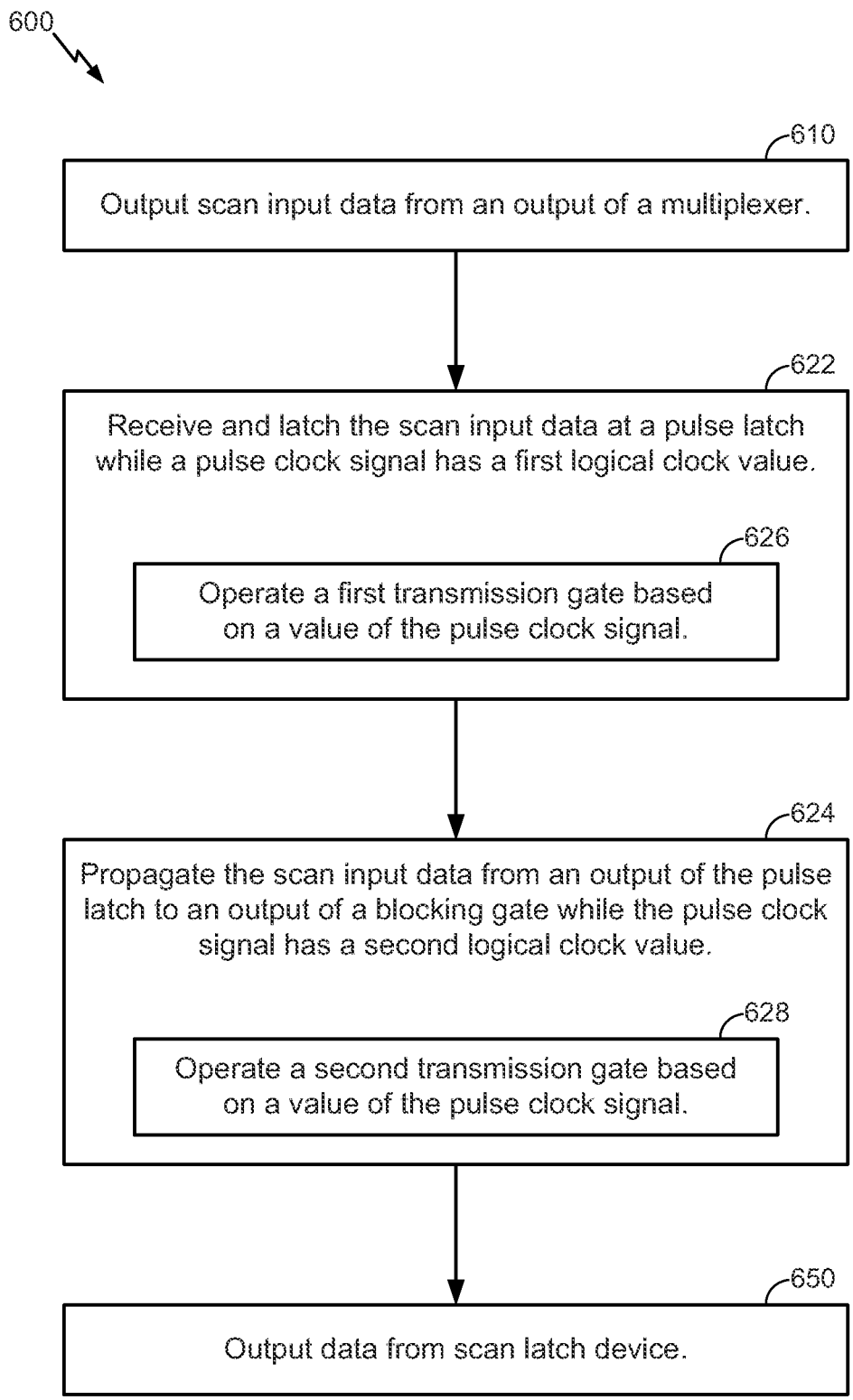
FIG. 6 is a flow chart of a particular illustrative embodiment of a method of testing a stage of a scan chain device.

Referring to FIG. 6, a flow chart of a particular illustrative embodiment of a method of testing a scan latch device is disclosed and generally designated 600. The method 600 may be performed by the system 100 of FIG. 1, the system 200 of FIG. 2, or the stage 300 of FIG. 3.

The method 600 may include outputting scan input data from an output of a multiplexer, at 610. For example, the multiplexer may include the multiplexer 110 of FIG. 1 or the multiplexer 210 of FIG. 2. The scan input data may be received at an input of the multiplexer from a test interface. In a particular embodiment, the multiplexer may output the scan input data when a test mode is enabled based, on a test control signal received at the multiplexer from the test interface.

The method 600 may further include receiving and latching the scan input data at a pulse latch while a pulse clock signal has a first logical clock value, at 622. The scan input data may be received at the pulse latch from the multiplexer or from a previous stage of the scan chain. The received scan input data may be latched by a latching element of the pulse latch. For example, the pulse latch may include the pulse latch 150 of FIG. 1 or the pulse latch 350 of FIG. 3. The method may also include operating a first transmission gate based on a value of the pulse clock signal, at 626. The first transmission gate may be enabled (e.g., closed) based on the value of the pulse clock signal. The enabled first transmission gate may permit received data to be provided to the latching element that latches the received scan input data. For example, the first transmission gate may include the first transmission gate 352 of FIG. 3.

In a particular embodiment, the scan input data is provided to the pulse latch via the first transmission gate. When the pulse clock signal has a first logical clock value, the first transmission gate may be enabled (e.g., closed) to receive the scan input data. The received scan input data may be provided to a latching element of the pulse latch, via the enabled first clocked gate, to latch the received scan input data The method 600 may further include propagating the scan input data from an output of the pulse latch to an output of a blocking gate while the pulse clock signal has a second logical clock value, at 624. The blocking gate may include the blocking gate 160 of FIG. 1, the blocking gate 360 of FIG. 3, or the blocking gate 460 of FIG. 4. The data output from the blocking gate may be provided to a subsequent stage (e.g., the first stage 120 of FIG. 1, the first stage 220, the second stage 230, or the N$^{th}$ stage 240 of FIG. 2, or the scan latch 320 of FIG. 3) or a test interface (e.g., the test interface 205 of FIG. 2). The method 600 may also include operating a second transmission gate based on a value of the pulse clock signal, at 628. The second transmission gate may include the second transmission gate 370 of FIG. 3 or the transmission gate 470 of FIG. 4. For example, the second transmission gate may be operated (e.g., closed) to propagate the scan input data from the output of the pulse latch via the blocking gate while the pulse clock signal has the second logical clock value.

The method 600 further includes outputting data from the scan latch device, at 650. The data output may include the shift_out data 190 of FIG. 1, the output 292 of FIG. 2, the shift_out data 390 of FIG. 3, the shift_out data 490 of FIG. 4, or the output shift_out signal 550 of FIG. 5. The data may be output to a test interface and/or to a subsequent stage.

The method 600 may enable scan chain testing of a scan latch that includes a pulse latch in a way that may reduce a likelihood of a race condition and may reduce an overall size and cost of the scan latch by coupling a blocking gate to an output of the pulse latch to prevent data being latched at the pulse latch from propagating to a subsequent pulse latch.

Figure 7:
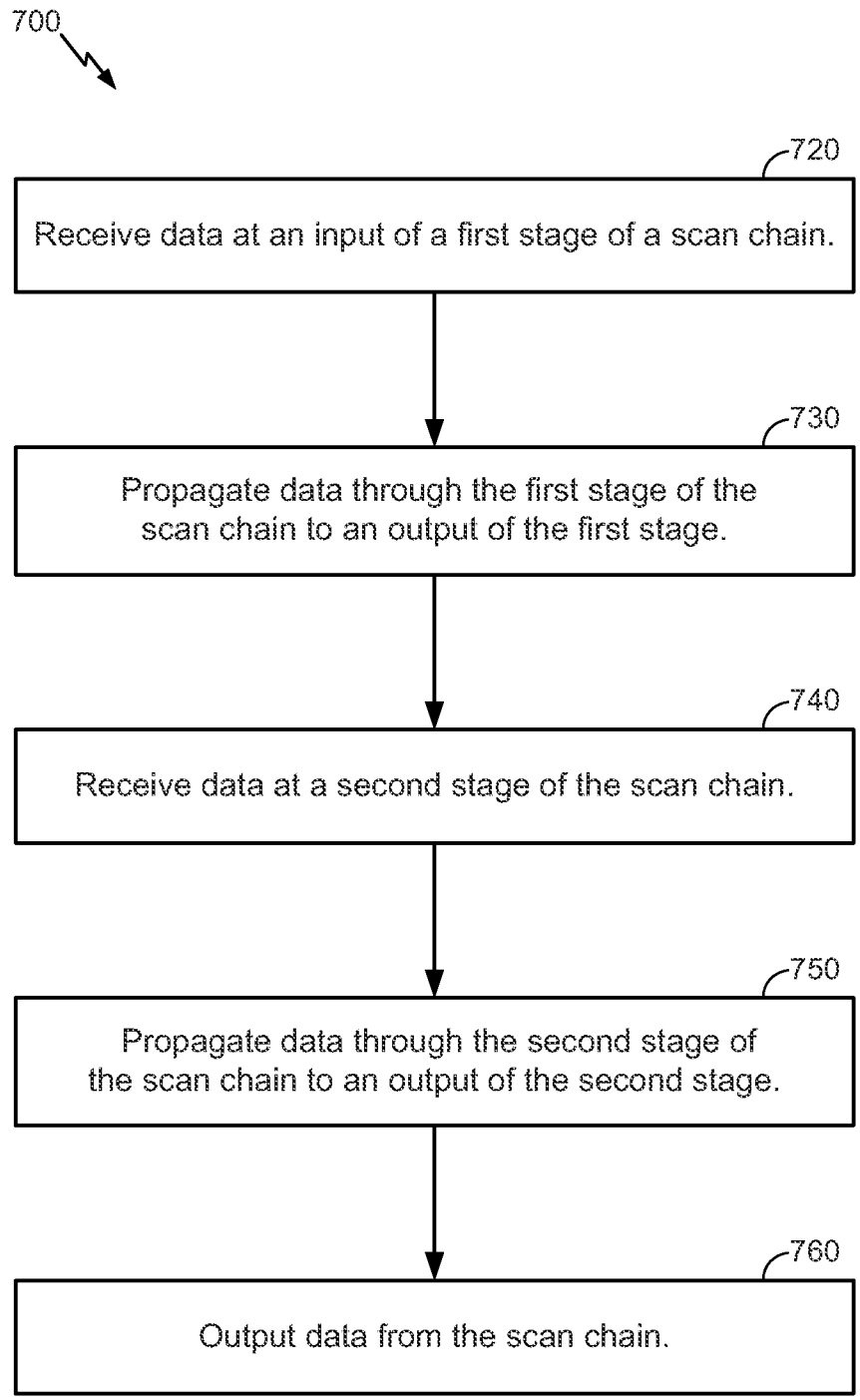
FIG. 7 is a flow chart of a particular illustrative embodiment of a method of testing a scan chain device including a plurality of stages.

Referring to FIG. 7, a flow chart of a particular illustrative embodiment of a method of testing a scan chain device is disclosed and generally designated 700. The method 700 may be performed by the system 100 of FIG. 1, the system 200 of FIG. 2, or the stage 300 of FIG. 3.

The method 700 may include receiving data at an input of a first stage of a scan chain, at 720. The first stage may include the first stage 120 of FIG. 1, the first stage 220, the second stage 230, or the $N^{th}$ stage 240 of FIG. 2, or the scan latch 320 of FIG. 3. In a particular embodiment, the first stage may be an initial stage of a scan chain and the data may be received from a multiplexer. The data received from the multiplexer may be provided to the multiplexer by a test interface. In an alternative embodiment, the data may be received at the first stage from a preceding stage (e.g., the first stage 120 of FIG. 1, the first stage 220 or the second stage 230 of FIG. 2, or the scan latch 320 of FIG. 3). Receiving the data at the input of the first stage may include receiving and latching the scan input data at a first pulse latch while a pulse clock signal has a first logical clock value and while a first transmission gate is enabled based on a value of the pulse clock signal.

The method 700 may further include propagating data through the first stage of the scan chain to an output of the first stage, at 730. Propagating the data through the first stage of the scan chain to the output of the first stage may include propagating data from an output of the pulse latch to an output of a first blocking gate while the pulse clock signal has a second logical clock value and while a second transmission gate is enabled based on a value of the pulse clock signal. The data may be provided to a subsequent stage (e.g., the second stage 230 or the $N^{th}$ stage 240 of FIG. 2, or the scan latch 320 of FIG. 3) and/or to a test interface.

The method 700 may further include receiving data at an input of a second stage of a scan chain, at 740. The second stage may include the first stage 120 of FIG. 1, the first stage 220, the second stage 230, or the $N^{th}$ stage 240 of FIG. 2, or the scan latch 320 of FIG. 3. In a particular embodiment, the second stage is a final stage. In an alternative embodiment, the second, stage is prior to a final stage. The data may be received at the second stage from a preceding stage (e.g., the first stage 120 of FIG. 1, the first stage 220 or the second stage 230 of FIG. 2, or the scan latch 320 of FIG. 3). Receiving the data at the input of the second stage may further include receiving and latching the scan input data at a second pulse latch while a pulse clock signal has a first logical clock value and while a third transmission gate is enabled based on a value of the pulse clock signal. The third transmission gate may include the first transmission gate 352 of FIG. 3.

The method 700 may further include propagating data through the second stage of the scan chain to an output of the second stage, at 750. Propagating the data through the second stage of the scan chain to an output of the second stage may include propagating data from an output of the pulse latch to an output of a second blocking gate while the pulse clock signal has a second logical clock value and while a fourth transmission gate is enabled based on a value of the pulse clock signal. The fourth transmission gate may include the second transmission gate 370 of FIG. 3 or the first transmission gate 470 of FIG. 4. The data may be provided to a subsequent stage and/or to a test interface.

The method 700 further includes outputting data from the scan chain. For example, the data output from the scan chain may include the shift_out data 190 of FIG. 1, the output 292 of FIG. 2, the shift_out data 390 of FIG. 3, or the shift_out data 490 of FIG. 4. In a particular embodiment, the data is output from a final stage of the scan chain. In an alternative embodiment, the data may be output to a test interface (e.g., the test interface 205 of FIG. 2) and/or to a subsequent stage (e.g., the second stage 230 or the $N^{th}$ stage 240 of FIG. 2).

Although the method 700 describes testing of two stages of a scan chain, it can be appreciated by one of skill in the art that the method can be adapted to test one stage or more than two stages. The method 700 may enable testing of a scan chain having pulse latches by inserting a blocking gate between successive pulse latches to prevent data being latched at each pulse latch from propagating to a subsequent pulse latch in order to reduce the probability of a race condition and reduce an overall size and cost of a scan chain.

The method 600 and the method 700 may be implemented by a field-programmable gate array (FPGA) device, an application-specific integrated circuit (ASIC), a processing unit such as a central processing unit (CPU), a digital signal processor (DSP), a controller, another hardware device, a firmware device, or any combination thereof. As an example, the method 600 of FIG. 6 and the method 700 of FIG. 7 can be initiated by a processor that executes instructions by providing shift_in data to a scan latch and/or to a scan chain, as described with respect to FIG. 8.

Figure 8:
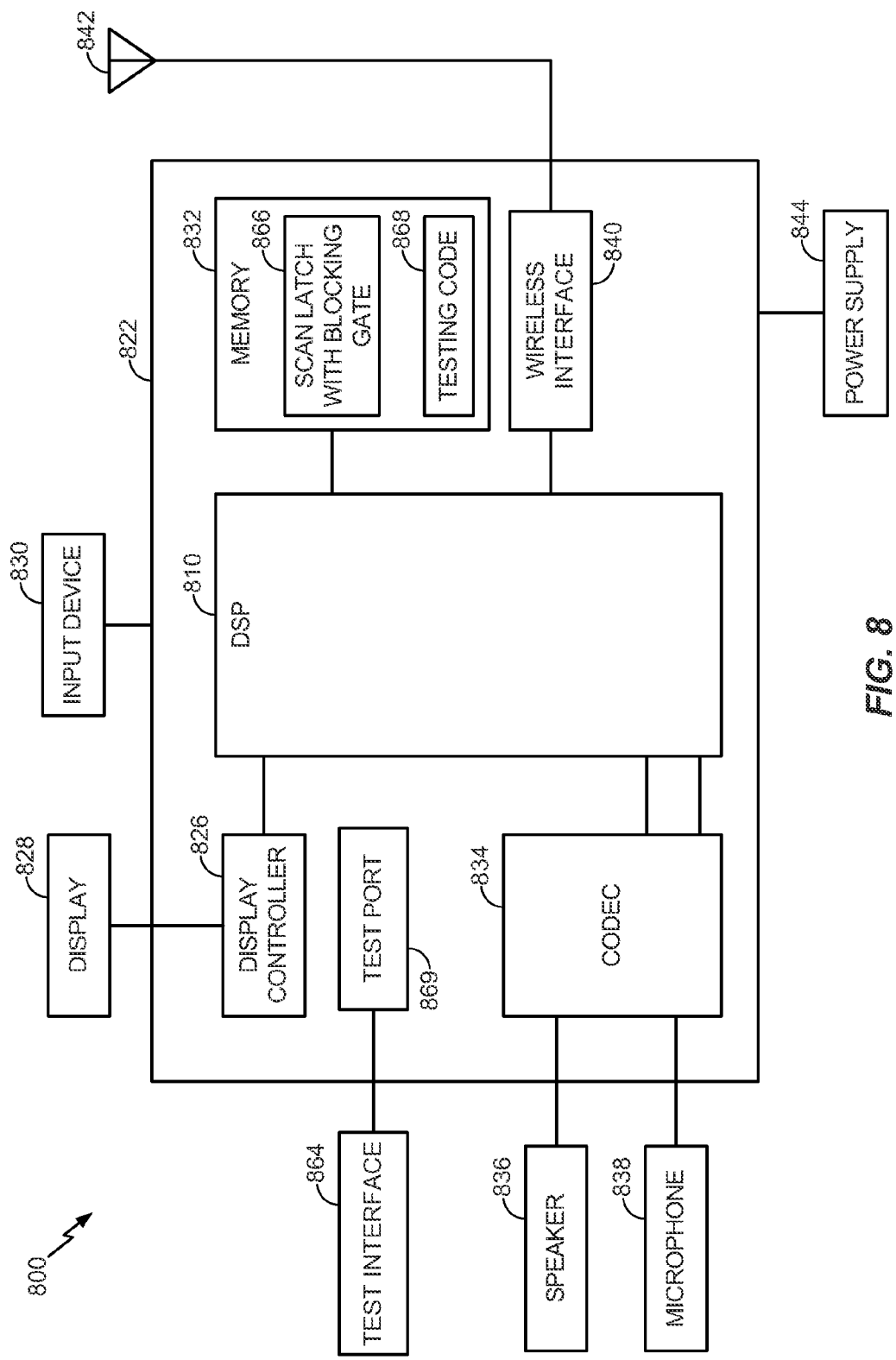
FIG. 8 is a block diagram of a wireless device including a memory that includes a scan latch with a blocking gate of a scan chain.

Referring to FIG. 8, a block diagram of a particular illustrative embodiment of a wireless communication device is depicted and generally designated 800. The device 800 includes a processor, such as a digital signal processor (DSP) 810, coupled to a memory 832. The digital signal processor 810 may include the processor 206 of FIG. 2. The memory 832 may include a scan latch with a blocking gate 866. In an illustrative embodiment, the scan latch with the blocking gate 866 may include the first stage 120 of FIG. 1, the first stage 220, the second stage 230, or the $N^{th}$ stage 240 of FIG. 2, the scan latch 320 of FIG. 3, or may operate according to the timing diagram 500 of FIG. 5 or the methods of FIG. 6 or 7, or any combination thereof.

The scan latch with the blocking gate 866 may include a pulse latch and a blocking gate. The pulse latch may be operable to receive and latch data while a first pulse clock signal has a first logical clock value. The blocking gate may be operable to propagate data received from the pulse latch to the output of the blocking gate, such as while a second pulse clock signal has a second logical clock value. An input to the scan latch with the blocking gate 866 may be coupled to a multiplexer (e.g., the multiplexer 110 of FIG. 1 or the multiplexer 210 of FIG. 2) that is operable to receive data via a test interface 864. In a particular embodiment, the scan latch with the blocking gate 866 includes the multiplexer. The test interface 864 may be coupled to the device 800 via a test port 869. The test port 869 may be a Joint Test Action Group (JTAG) port. The test interface 864 may provide a test control signal to the multiplexer, and the scan input data may be provided to the scan latch with a blocking gate 866 via the multiplexer. The test interface 864 may generate a pulse clock signal to operate the scan latch with the blocking gate 866. The test interface 864 may also receive data output from the scan latch with the blocking gate 866. In a particular embodiment, the test interface is external to the device 800 and includes a processor (not shown), such as the processor 206 of FIG. 2.

In an alternative embodiment, the test interface may be implemented on-chip, such as via the digital signal processor 810. The memory 832 may be a non-transient computer readable medium storing testing code 868 that includes processor executable instructions executable by the digital signal processor 810 to cause the digital signal processor 810 to provide a test control signal to the multiplexer and provide scan input data to the multiplexer. The testing code 868 may also include instructions that may farther cause the digital signal processor 810 to generate a pulse clock signal The testing code 868 may also include instructions that farther cause the digital signal processor 810 to receive data output from the scan latch with the blocking gate 866.

FIG. 8 also shows a display controller 826 that is coupled to the digital signal processor 810 and to a display 828. A coder/decoder (CODEC) 834 can also be coupled to the digital signal processor 810. A speaker 836 and a microphone 838 can be coupled to the CODEC 834.

FIG. 8 also indicates that a wireless controller 840 can be coupled to the digital signal processor 810 and to a wireless antenna 842. In a particular embodiment, the DSP 810, the display controller 826, the memory 832, the CODEC 834, and the wireless controller 840 are included in a system-in-package or system-on-chip device 822. In a particular embodiment, an input device 830 and a power supply 844 are coupled to the system-on-chip device 822. Moreover, in a particular embodiment, as illustrated in FIG. 8, the display 828, the input device 830, the speaker 836, the microphone 838, the wireless antenna 842, and the power supply 844 are external to the system-on-chip device 822, However, each of the display 828, the input device 830, the speaker 836, the microphone 838, the wireless antenna 842, and the power supply 844 can be coupled to a component of the system-on-chip device 822, such as an interface or a controller.

In conjunction with the described embodiments, a system is disclosed that may include means for receiving and latching scan input data while a pulse clock signal has a first logical clock value. The means for receiving and latching may include the pulse latch 150 of FIG. 1, the pulse latch 350 of FIG. 3; a portion of the memory 832 or a portion of the scan latch with a blocking gate 866 of FIG. 8; one or more other devices or circuits configured to receive and latch scan input data while a pulse clock signal has a first logical clock value; or any combination thereof. The system may also include means for propagating the scan input data from the means for receiving and latching to an output of a blocking gate while the pulse clock signal has a second logical clock value. The means for propagating may include the blocking gate 160 of FIG. 1, a blocking gate of the first stage 220, a blocking gate of the second stage 230. or a blocking gate of the N$^{th}$ stage 240 of FIG. 2, the blocking gate 360 of FIG. 3, the blocking gate 460 of FIG. 4, a blocking gate of the scan latch with a blocking gate 866 of FIG. 8. one or more other devices or circuits configured to propagate the scan input data from the means for receiving and latching to an output of a blocking gate while the pulse clock signal has a second logical clock value; or any combination thereof. The means for receiving and latching and. the means for propagating may be included in a single stage, such as the first stage 120 of FIG. 1, the first stage 220, the second stage 230, or the N$^{th}$ stage 240 of FIG. 2, or scan latch 320 of FIG. 3.

The system may also include means for generating the pulse clock signal. The means for generating the pulse clock signal may include the processor 206 and/or the test interface 205 of FIG. 2; the test interface 864, the memory 832, the digital signal processor 810, or the testing code 868 of FIG 8; one or more other devices or circuits configured to generate the pulse clock signal; or any combination thereof. In an embodiment, the pulse clock signal may include the first pulse clock signal 116 or the second pulse clock signal 118 of FIG. 1, the first pulse clock signal 216 or the second pulse clock signal 218 of FIG. 2, the first pulse clock signal 316 or the second pulse clock signal 318 of FIG. 3, or the second pulse clock signal 418 or the first pulse clock signal 419 of FIG. 4.

The foregoing disclosed devices and functionalities may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above, FIG. 9 depicts a particular illustrative embodiment of an electronic device manufacturing process 900.

Physical device information 902 is received at the manufacturing process 900, such as at a research computer 906. The physical device information 902 may include design information representing at least one physical property of a semiconductor device, such as the multiplexer 110 and/or the first stage 120 including the pulse latch 150 and/or the blocking gate 160 of FIG. 1, the multiplexer 210, the first stage 220, the second stage 230, and/or the N$^{th}$ stage of FIG. 2, the scan latch 320 including the pulse latch 350 and/or the blocking gate 360 of FIG. 3, the blocking gate 460 of FIG. 4, the memory 832 and/or the scan latch with blocking gate 866 of FIG. 8, or any combination thereof. For example, the physical device information 902 may include physical parameters, material characteristics, and. structure information that is entered via a user interface 904 coupled to the research computer 906. The research computer 906 includes a processor 908, such as one or more processing cores, coupled to a computer readable medium such as a memory 910. The memory 910 may store computer readable instructions that are executable to cause the processor 908 to transform the physical device information 902 to comply with a file format and to generate a library file 912.

In a particular embodiment, the library file 912 includes at least one data file including the transformed design information. For example, the library file 912 may include a library of semiconductor devices including a device that includes the multiplexer 110 and/or the first stage 120 including the pulse latch 150 and/or the blocking gate 160 of FIG. 1, the multiplexer 210, the first stage 220, the second stage 230, and/or the N$^{th}$ stage of FIG, 2, the scan latch 320 including the pulse latch 350 and/or the blocking gate 360 of FIG. 3, the blocking gate 460 of FIG. 4, the memory 832 and/or the scan latch with blocking gate 866 of FIG. 8, or any combination thereof, that is provided for use with an electronic design automation (EDA) tool 920.

The library file 912 may be used in conjunction with the EDA tool 920 at a design computer 914 including a processor 916, such as one or more processing cores, coupled to a memory 918. The EDA tool 920 may be stored as processor executable instructions at the memory 918 to enable a user of the design computer 914 to design a circuit including the multiplexer 110 and/or the first stage 120 including the pulse latch 150 and/or the blocking gate 160 of FIG. 1, the multiplexer 210, the first stage 220, the second stage 230, and/or the N$^{th}$ stage of FIG. 2, the scan latch 320 including the pulse latch 350 and/or the blocking gate 360 of FIG. 3, the blocking gate 460 of FIG. 4, the memory 832 and/or the scan latch with blocking gate 866 of FIG. 8, or any combination thereof, of the library file 912. For example, a user of the design computer 914 may enter circuit design information 922 via a user interface 924 coupled to the design computer 914. The circuit design information 922 may include design information representing at least one physical property of a semiconductor device, such as the multiplexer 110 and/or the first stage 120 including the pulse latch 150 and/or the blocking gate 160 of FIG. 1, the multiplexer 210, the first stage 220, the second stage 230, and/or the N$^{th}$ stage of FIG. 2, the scan latch 320 including the pulse latch 350 and/or the blocking gate 360 of FIG. 3, the blocking gate 460 of FIG. 4, the memory 832 and/or the scan latch with blocking gate 866 of FIG. 8, or any combination thereof. To illustrate, the circuit design property may include identification of particular circuits and relationships to other elements in a circuit design, positioning information, feature size information, interconnection information, or other information representing a physical property of a semiconductor device.

The design computer 914 may be configured to transform the design information, including the circuit design information 922, to comply with a file format. To illustrate, the file formation may include a database binary file format representing planar geometric shapes, text labels, and other information about a circuit layout in a hierarchical format, such as a Graphic Data System (GDSII) file format. The design computer 914 may be configured to generate a data file including the transformed design information, such as a GDSII file 926 that includes information describing the multiplexer 110 and/or the first stage 120 including the pulse latch 150 and/or the blocking gate 160 of FIG. 1, the multiplexer 210, the first stage 220, the second stage 230, and/or the N$^{th}$ stage of FIG. 2, the scan latch 320 including the pulse latch 350 and/or the blocking gate 360 of FIG. 3, the blocking gate 460 of FIG. 4, the memory 832 and/or the scan latch with blocking gate 866 of FIG. 8, or any combination thereof, in addition to other circuits or information. To illustrate, the data file may include information corresponding to a system-on-chip (SOC) that includes the multiplexer 110 and/or the first stage 120 including the pulse latch 150 and/or the blocking gate 160 of FIG. 1, the multiplexer 210, the first stage 220, the second stage 230, and/or the N$^{th}$ stage of FIG. 2, the scan latch 320 including the pulse latch 350 and/or the blocking gate 360 of FIG. 3, and/or the blocking gate 460 of FIG. 4, and/or the memory 832 and/or the scan latch with blocking gate 866 of FIG. 8, and that also includes additional electronic circuits and components within the SOC.

The GDSII file 926 may be received at a fabrication process 928 to manufacture the multiplexer 110 and/or the first stage 120 including the pulse latch 150 and/or the blocking gate 160 of FIG. 1, the multiplexer 210, the first stage 220, the second stage 230, and/or the N$^{th}$ stage of FIG. 2, the scan latch 320 including the pulse latch 350 and/or the blocking gate 360 of FIG. 3, the blocking gate 460 of FIG. 4, the memory 832 and/or the scan latch with blocking gate 866 of FIG. 8, or any combination thereof, according to transformed information in the GDSII file 926. For example, a device manufacture process may include providing the GDSII file 926 to a mask manufacturer 930 to create one or more masks, such as masks to be used with photolithography processing, illustrated as a representative mask 932. The mask 932 may be used during the fabrication process to generate one or more wafers 934, which may be tested and separated into dies, such as a representative die 936. The die 936 includes a circuit including a device that includes the multiplexer 110 and/or the first stage 120 including the pulse latch 150 and/or the blocking gate 160 of FIG. 1, the multiplexer 210, the first stage 220, the second stage 230, and/or the N$^{th}$ stage of FIG. 2, the scan latch 320 including the pulse latch 350 and/or the blocking gate 360 of FIG. 3, the blocking gate 460 of FIG. 4, the memory 832 and/or the scan latch with blocking gate 866 of FIG. 8, or any combination thereof.

The die 936 may be provided to a packaging process 938 where the die 936 is incorporated into a representative package 940. For example, the package 940 may include the single die 936 or multiple dies, such as a system-in-package (SiP) arrangement. The package 940 may be configured to conform to one or more standards or specifications, such as Joint Electron Device Engineering Council (JEDEC) standards.

Information regarding the package 940 may be distributed to various product designers, such as via a component library stored at a computer 946. The computer 946 may include a processor 948, such as one or more processing cores, coupled to a memory 950. A printed circuit board. (PCB) tool may be stored as processor executable instructions at the memory 950 to process PCB design information 942 received from a user of the computer 946 via a user interface 944. The PCB design information 942 may include physical positioning information of a packaged semiconductor device on a circuit board, the packaged semiconductor device corresponding to the package 940 including the multiplexer 110 and/or the first stage 120 including the pulse latch 150 and/or the blocking gate 160 of FIG. 1, the multiplexer 210, the first stage 220, the second stage 230. and/or the N$^{th}$ stage of FIG. 2, the scan latch 320 including the pulse latch 350 and/or the blocking gate 360 of FIG. 3, the blocking gate 460 of FIG. 4, the memory 832 and/or the scan latch with blocking gate 866 of FIG. 8, or any combination thereof.

The computer 946 may be configured to transform the PCB design information 942 to generate a data file, such as a GERBER file 952 with data that includes physical positioning information of a packaged semiconductor device on a circuit board, as well as layout of electrical connections such as traces and vias, where the packaged semiconductor device corresponds to the package 940 including the multiplexer 110 and/or the first stage 120 including the pulse latch 150 and/or the blocking gate 160 of FIG. 1, the multiplexer 210, the first stage 220, the second stage 230, and/or the N$^{th}$ stage of FIG. 2, the scan latch 320 including the pulse latch 350 and/or the blocking gate 360 of FIG. 3, the blocking gate 460 of FIG. 4, the memory 832 and/or the scan latch with blocking gate 866 of FIG. 8, or any combination thereof. In other embodiments, the data file generated by the transformed. PCB design information may have a format other than a GERBER format.

The GERBER file 952 may be received at a board assembly process 954 and used to create PCBs, such as a representative PCB 956, manufactured in accordance with the design information stored within the GERBER file 952. For example, the GERBER file 952 may be uploaded to one or more machines to perform various steps of a PCB production process. The PCB 956 may be populated with electronic components including the package 940 to form a representative printed circuit assembly (PCA) 958.

Figure 9:
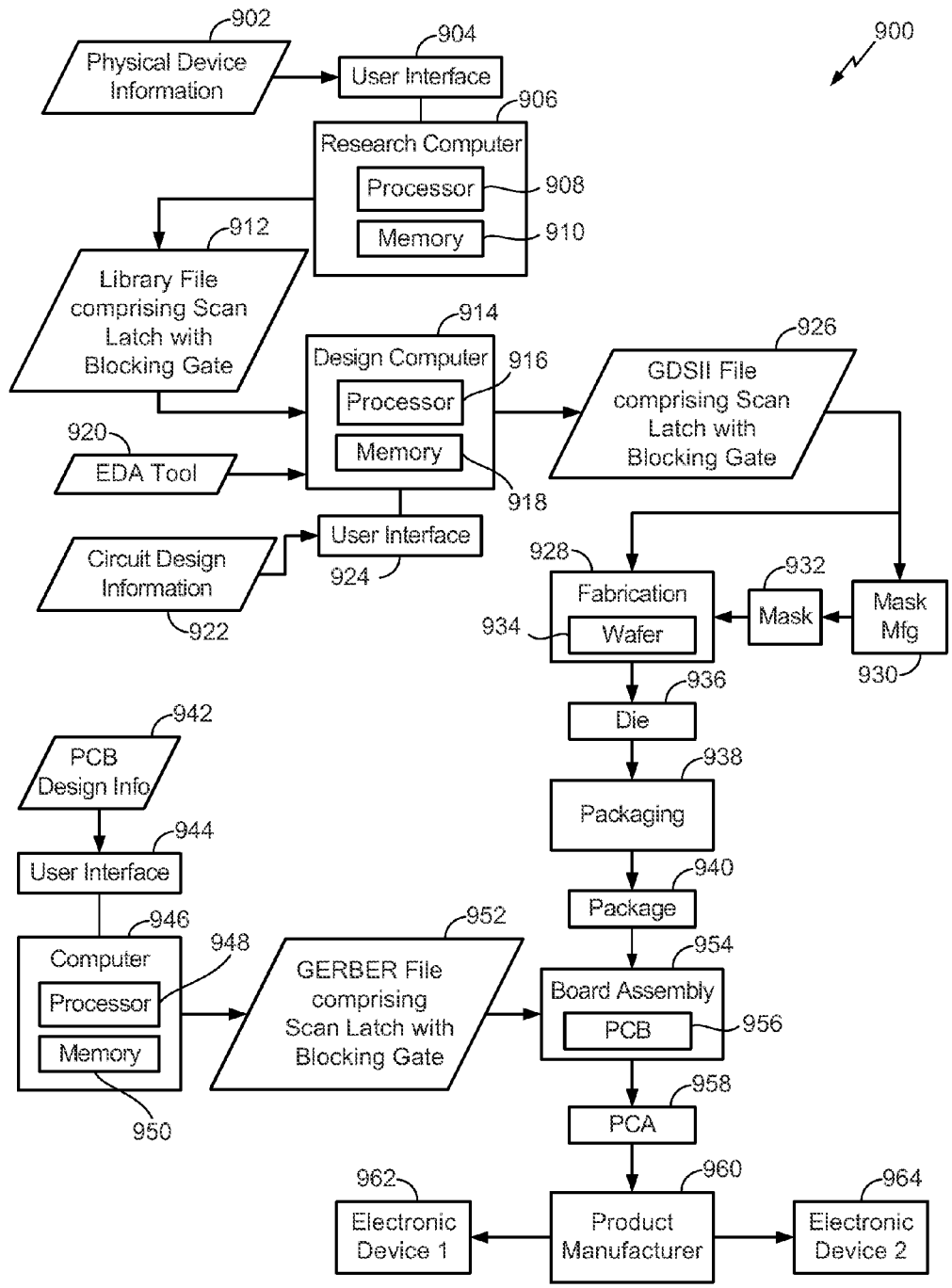
FIG. 9 is a data flow diagram of a particular illustrative embodiment of a manufacturing process to manufacture electronic devices that include a scan chain having a blocking gate in a stage of the scan chain.

The PCA 958 may be received at a product manufacture process 960 and integrated into one or more electronic devices, such as a first representative electronic device 962 and a second representative electronic device 964. As an illustrative, non-limiting example, the first representative electronic device 962, the second representative electronic device 964, or both, may be selected from the group of a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player, into which the multiplexer 110 and/or the first stage 120 including the pulse latch 150 and/or the blocking gate 160 of FIG. 1, the multiplexer 210, the first stage 220, the second stage 230, and/or the N*th* stage of FIG. 2, the scan latch 320 including the pulse latch 350 and/or the blocking gate 360 of FIG. 3, the blocking gate 460 of FIG. 4, the memory 832 and/or the scars latch with blocking gate 866 of FIG. 8, or any combination thereof, is integrated. As another illustrative, non-limiting example, one or more of the electronic devices 962 and 964 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 9 illustrates remote units according to teachings of the disclosure, the disclosure is not limited to these illustrated units. Embodiments of the disclosure may be suitably employed in any device which includes active integrated circuitry including memory and on-chip circuitry.

A device that includes the multiplexer 110 and/or the first stage 120 including the pulse latch 150 and/or the blocking gate 160 of FIG. 1, the multiplexer 210, the first stage 220, the second stage 230, and/or the N*th* stage of FIG. 2, the scan latch 320 including the pulse latch 350 and/or the blocking gate 360 of FIG. 3, the blocking gate 460 of FIG. 4, the memory 832 and/or the scan latch with blocking gate 866 of FIG. 8, or any combination thereof, may be fabricated, processed, and incorporated into an electronic device, as described in the illustrative process 900. One or more aspects of the embodiments disclosed with respect to FIGS. 1-8 may be included at various processing stages, such as within the library file 912, the GDSII file 926, and the GERBER file 952, as well as stored at the memory 910 of the research computer 906, the memory 918 of the design computer 914, the memory 950 of the computer 946, the memory of one or more other computers or processors (not shown) used at the various stages, such as at the board assembly process 954, and also incorporated into one or more other physical embodiments such as the mask 932, the die 936, the package 940, the PCA 958, other products such as prototype circuits or devices (not shown), or any combination thereof. Although various representative stages of production from a physical device design to a final product are depicted, in other embodiments fewer stages may be used or additional stages may be included. Similarly, the process 900 may be performed by a single entity or by one or more entities performing various stages of the process 900.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described, above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two, A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated, circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and. the principles defined herein may be applied, to other embodiments without departing from the scope of the disclosure. Thus, the present disclosure is not intended to be limited to the embodiments shown herein but is to be accorded the widest scope possible consistent with, the principles and novel features as defined by the following claims.

What is claimed is:

1. An apparatus comprising a scan latch, the scan latch comprising:
   a pulse latch operable to receive data while a pulse clock signal has a first logical clock value, wherein the pulse latch comprises a first transmission gate and a latching element, and wherein the first transmission gate comprises a first transistor having a first channel length; and
   a blocking gate coupled to an output of the pulse latch and operable to propagate data from the output of the pulse latch while the pulse clock signal has a second logical clock value, wherein the blocking gate comprises a second transmission gate, and wherein the second transmission gate comprises a second transistor having a second channel length that is greater than the first channel length.

2. The apparatus of claim 1, wherein the first logical clock value is associated with a pulse phase of the pulse clock signal and wherein the second logical clock value is associated with a non-pulse phase of the pulse clock signal.

3. The apparatus of claim 1, wherein the first transmission gate is responsive to the pulse clock signal.

4. The apparatus of claim 1, wherein the second transmission gate is responsive to an inverse of the pulse clock signal.

5. The apparatus of claim 1, wherein the second channel length is approximately twice as long as the first channel length.

6. The apparatus of claim 1, wherein the blocking gate further comprises a delay element coupled to an output of the second transmission gate.

7. The apparatus of claim 6, wherein the delay element comprises a third transmission gate configured in an always-on state.

8. The apparatus of claim 1, wherein the second transistor is a first long-channel transistor responsive to the pulse clock signal, and wherein the second transmission gate further comprises a second long-channel transistor responsive to an inverse of the pulse clock signal.

9. The apparatus of claim 1, further comprising a multiplexer coupled to the pulse latch.

10. The apparatus of claim 9, wherein the pulse latch is responsive to an output of the multiplexer.

11. The apparatus of claim 1, wherein:
the scan latch is a first stage of a scan chain, the pulse latch is a first pulse latch, and the blocking gate is a first blocking gate coupled to an output of the first pulse latch and operable to propagate data from the output of the first pulse latch to an output of the first stage while the pulse clock signal has the second logical clock value; and
the apparatus further comprises a second stage of the scan chain, wherein the second stage is responsive to the output of the first stage.

12. The apparatus of claim 11, wherein the second stage comprises:
a second pulse latch responsive to the output of the first stage and operable to receive data from the first stage while the pulse clock signal has the first logical clock value; and
a second blocking gate responsive to an output of the second pulse latch and operable to propagate data from the second pulse latch to an output of the second stage while the pulse clock signal has the second logical clock value.

13. The apparatus of claim 12, wherein the first stage and the second stage are configured to receive the pulse clock signal.

14. The apparatus of claim 13, wherein the pulse clock signal is a first pulse clock signal, wherein the first stage and the second stage are configured to receive a second pulse clock signal, and wherein the second pulse clock signal is an inverse of the first pulse clock signal.

15. The apparatus of claim 11, further comprising a multiplexer coupled to the first stage wherein the first stage is responsive to an output of the multiplexer.

16. The apparatus of claim 15, wherein the multiplexer is responsive to a test control signal.

17. The apparatus of claim 16, wherein:
when the test control signal is disabled, the multiplexer is operable to provide input data to the first stage; and
when the test control signal is enabled, the multiplexer is operable to provide scan input data to the first stage.

18. The apparatus of claim 17, wherein the scan input data is received at the multiplexer from a test interface via a test port.

19. The apparatus of claim 18, wherein the test port is a Joint Test Action Group (JTAG) port.

20. A scan latch comprising:
a pulse latch operable to receive data while a pulse clock signal has a first logical clock value, wherein the pulse latch comprises a first transmission gate and a latching element; and
a blocking gate coupled to an output of the pulse latch and operable to propagate data from the output of the pulse latch while the pulse clock signal has a second logical clock value, wherein the blocking gate comprises a second transmission gate and a delay element coupled to an output of the second transmission gate, and wherein the delay element comprises a third transmission gate configured in an always-on state.

21. A method comprising:
receiving and latching scan input data at a pulse latch while a pulse clock signal has a first logical clock value, wherein the pulse latch comprises a first transmission gate and a latching element, and wherein the first transmission gate comprises a first transistor having a first channel length; and
propagating the scan input data from an output of the pulse latch to an output of a blocking gate while the pulse clock signal has a second logical clock value, wherein the blocking gate comprises a second transmission gate, and wherein the second transmission gate comprises a second transistor having a second channel length that is greater than the first channel length.

22. The method of claim 21, wherein receiving and latching the scan input data comprises:
receiving the scan input data at the first transmission gate of the pulse latch;
providing the scan input data from an output of the first transmission gate to the latching element of the pulse latch while the pulse clock signal has the first logical clock value; and
latching the scan input data at the latching element.

23. The method of claim 21, further comprising enabling the first transmission gate of the pulse latch when the pulse clock signal has the first logical clock value.

24. The method of claim 21, wherein the second transmission gate of the blocking gate propagates the scan input data from the output of the pulse latch to the output of the blocking gate while the pulse clock signal has the second logical clock value.

25. The method of claim 21, further comprising providing the scan input data from a multiplexer to the pulse latch.

26. The method of claim 25, further comprising enabling a test mode of the multiplexer responsive to a test control signal, wherein the multiplexer provides the scan input data when the test mode is enabled.

27. The method of claim 25, further comprising receiving the scan input data at the multiplexer from a test interface.

28. The method of claim 21, wherein the second channel length is approximately twice as long as the first channel length.

29. A scan latch comprising:
means for receiving and latching scan input data while a pulse clock signal has a first logical clock value, wherein the means for receiving and latching comprises a first transmission gate and a latching element, and wherein the first transmission gate comprises a first transistor having a first channel length; and
means for propagating the scan input data from the means for receiving and latching to an output of a blocking gate while the pulse clock signal has a second logical clock value, wherein the means for propagating comprises a second transmission gate, and wherein the second transmission gate comprises a second transistor having a second channel length that is greater than the first channel length.

30. The scan latch of claim 29, further comprising a plurality of stages, wherein the means for receiving and latching and the means for propagating comprise a single stage.

31. The scan latch of claim 29, further comprising means for generating the pulse clock signal.

32. A non-transitory computer readable medium comprising instructions that when executed by a processor, cause the processor to:
provide a test control signal to a multiplexer of a scan latch circuit; and
provide scan input data to the multiplexer;
wherein a pulse latch of the scan latch circuit receives and latches the scan input data from the multiplexer while a pulse clock signal has a first logical clock value, wherein the pulse latch comprises a first transmission gate and a latching element, and wherein the first transmission gate comprises a first transistor having a first channel length; and
wherein the scan input data propagates from the pulse latch to an output of a blocking gate of the scan latch circuit while the pulse clock signal has a second logical clock value, wherein the blocking gate comprises a second transmission gate, and wherein the second transmission gate comprises a second transistor having a second channel length that is greater than the first channel length.

33. The non-transitory computer readable medium of claim 32, further comprising instructions that when executed by the processor, cause the processor to receive output data from an output of the scan latch circuit.

34. The non-transitory computer readable medium of claim 32, further comprising instructions that, when executed by the processor, cause the processor to generate the pulse clock signal.

35. A method comprising:
receiving design information representing at least one physical property of a semiconductor device, the semiconductor device comprising:
a pulse latch operable to receive data while a pulse clock signal has a first logical clock value, wherein the pulse latch comprises a first transmission gate and a latching element and wherein the first transmission gate comprises a first transistor having a first channel length; and
a blocking gate coupled to an output of the pulse latch and operable to propagate data from the output of the pulse latch while the pulse clock signal has a second logical clock value, wherein the blocking gate comprises a second transmission gate, and wherein the second transmission gate comprises a second transistor having a second channel length that is greater than the first channel length;
transforming the design information to comply with a file format; and
generating a data file including the transformed design information.

36. The method of claim 35, wherein the data file comprises a GDSII format.

37. A method comprising:
receiving a data file comprising design information corresponding to a semiconductor device; and
fabricating the semiconductor device according to the design information, wherein the semiconductor device comprises:
a pulse latch operable to receive data while a pulse clock signal has a first logical clock value, wherein the pulse latch comprises a first transmission gate and a latching element, and wherein the first transmission gate comprises a first transistor having a first channel length; and
a blocking gate coupled to an output of the pulse latch and operable to propagate data from the output of the pulse latch while the pulse clock signal has a second logical clock value, wherein the blocking gate comprises a second transmission gate, and wherein the second transmission gate comprises a second transistor having a second channel length that is greater than the first channel length.

38. The method of claim 37, wherein the data file comprises a GDSII format.

39. A method comprising:
receiving design information comprising physical positioning information of a packaged semiconductor device on a circuit board, the packaged semiconductor device comprising:
a pulse latch operable to receive data while a pulse clock signal has a first logical clock value, wherein the pulse latch comprises a first transmission gate and a latching element, and wherein the first transmission gate comprises a first transistor having a first channel length; and
a blocking gate coupled to an output of the pulse latch and operable to propagate data from the output of the pulse latch while the pulse clock signal has a second logical clock value, wherein the blocking gate comprises a second transmission gate, and wherein the second transmission gate comprises a second transistor having a second channel length that is greater than the first channel length; and
transforming the design information to generate a data file.

40. The method of claim 39, wherein the data file comprises a GERBER format.

41. A method comprising:
receiving a data file comprising design information comprising physical positioning information of a packaged semiconductor device on a circuit board; and
manufacturing the circuit board configured to receive the packaged semiconductor device according to the design information, wherein the packaged semiconductor device comprises:
a pulse latch operable to receive data while a pulse clock signal has a first logical clock value, wherein the pulse latch comprises a first transmission gate and a latching element, and wherein the first transmission gate comprises a first transistor having a first channel length; and
a blocking gate coupled to an output of the pulse latch and operable to propagate data from the output of the pulse latch while the pulse clock signal has a second logical clock value, wherein the blocking gate comprises a second transmission gate, and wherein the second transmission gate comprises a second transistor having a second channel length that is greater than the first channel length.

42. The method of claim 41, wherein the data file comprises a GERBER format.

43. The method of claim 42, wherein the circuit board is integrated into one of the group consisting of a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player.

* * * * *